United States Patent
Kamijima et al.

(10) Patent No.: US 7,002,840 B2
(45) Date of Patent: Feb. 21, 2006

(54) MAGNETORESISTIVE ELEMENT INCLUDING A YOKE THAT SURROUNDS A CONDUCTOR, MAGNETIC MEMORY CELL AND MAGNETIC MEMORY DEVICE INCLUDING THE SAME

(75) Inventors: Akifumi Kamijima, Chou-ku (JP); Koji Shmazawa, Chou-ku (JP); Hitoshi Hatate, Chou-ku (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 10/967,297

(22) Filed: Oct. 19, 2004

(65) Prior Publication Data

US 2005/0117386 A1    Jun. 2, 2005

(30) Foreign Application Priority Data

Oct. 21, 2003  (JP)  ............................. 2003-361050

(51) Int. Cl.
 *G11C 11/15* (2006.01)
(52) U.S. Cl. ........................ 365/173; 365/171; 365/158
(58) Field of Classification Search ................ 365/173, 365/171, 158, 130
See application file for complete search history.

(56) References Cited

U.S. PATENT DOCUMENTS

| | | | |
|---|---|---|---|
| 5,343,422 A | 8/1994 | Kung et al. | 365/173 |
| 5,629,922 A | 5/1997 | Moodera et al. | 369/126 |
| 6,510,078 B1 * | 1/2003 | Schwarzl | 365/158 |
| 6,667,526 B1 * | 12/2003 | Komori | 257/421 |
| 2001/0050859 A1 | 12/2001 | Schwarzl | 365/158 |
| 2004/0100818 A1 * | 5/2004 | Yoda et al. | 365/173 |

FOREIGN PATENT DOCUMENTS

| | | |
|---|---|---|
| EP | 1 246 191 | 10/2002 |
| JP | 02-093373 | 4/1990 |
| JP | 09-091949 | 4/1997 |
| JP | 2001-236781 | 8/2001 |
| JP | 2001-273759 | 10/2001 |

* cited by examiner

*Primary Examiner*—Andrew Q. Tran
(74) *Attorney, Agent, or Firm*—Oliff & Berridge, PLC

(57) ABSTRACT

The present invention provides a magnetic memory device capable of stably performing information writing operation by efficiently using a magnetic field generated by current flowing in write lines and having a high degree of flexibility in designing. A magneto-resistive element has: a magnetic yoke disposed annularly in a circumferential direction so as to surround a write word line and a write bit line, and having a pair of open ends facing each other while sandwiching a gap provided in a part in the circumferential direction; and a stacked body including a second magnetic layer of which magnetization direction changes according to an external magnetic field and a pair of end faces. The stacked body is disposed in the gap so that each of the pair of end faces and each of the pair of open ends face each other. With the configuration, magnetization of the second magnetic layer can be efficiently inverted and, as compared with the case where the stacked body and the magnetic yoke are in contact with each other, the material of the stacked body can be selected from a wider range and the magnetic and electric performances of the stacked body can be sufficiently displayed.

16 Claims, 16 Drawing Sheets

「0」

「1」

MAGNETORESISTIVE ELEMENT INCLUDING A YOKE THAT SURROUNDS A CONDUCTOR, MAGNETIC MEMORY CELL AND MAGNETIC MEMORY DEVICE INCLUDING THE SAME

BACKGROUND OF THE INVENTION

1. Field of the Invention

The present invention relates to a magnetoresistive element including a magneto-sensitive layer of which magnetization direction changes according to an external magnetic field, a magnetic memory cell having the magnetoresistive element, and a magnetic memory device having the magnetic memory cell and recording/reading information by using a change in the magnetization direction of the magneto-sensitive layer.

2. Description of the Related Art

Conventionally, as general memories used for information processors such as a computer and a communication device, volatile memories such as a DRAM (Dynamic Random Access Memory) and an SRAM (Static RAM) are used. The volatile memories have to be refreshed by always supplying current to hold stored information. When the power source is, turned off, all of information is lost, so that a nonvolatile memory as means for recording information has to be provided in addition to the volatile memory. For example, a flash EEPROM, a magnetic hard disk drive, or the like is used.

In the nonvolatile memories, as the speed of information processing increases, increase in speed of an access is becoming an important subject. Further, as a portable information device is being rapidly spread and the performance is becoming higher, information device development aiming at so-called ubiquitous computing which means that information processing can be performed everywhere at any time is rapidly being progressed. Development of a nonvolatile memory adapted for higher-speed processing as a key device of such information device development is in strong demand.

As a technique effective to increase the speed of the nonvolatile memory, a magnetic random access memory (MRAM) is known in which magnetic memory elements each for storing information in accordance with the magnetization direction along the axis of easy magnetization of a ferromagnetic layer are arranged in a matrix. The MRAM stores information by using a combination of the magnetization directions in two ferromagnetic members. On the other hand, stored information is read by detecting a resistance change (that is, a change in current or voltage) which occurs between the case where the magnetization direction is parallel to a reference direction and the case where the magnetization direction is antiparallel to the reference direction. Since the MRAM operates with the principle, it is important that the resistance change ratio is as high as possible to perform stable writing and reading in the MRAM.

The MRAM currently used in practice utilizes the giant magneto-resistive (GMR) effect. The GMR effect is a phenomenon such that when two magnetic layers are disposed so that their axes of easy magnetization are parallel with each other, in the case where the magnetization directions of the layers are in parallel to the axis of easy magnetization, the resistance value becomes the minimum. In the case where the magnetization direction is antiparallel to the axis of easy magnetization, the resistance value becomes the maximum. An MRAM using a GMR element capable of obtaining such a GMR effect (hereinbelow, described as GMR-MRAM) is disclosed in, for example, U.S. Pat. No. 5,343,422.

Recently, aiming at further improvement in storing speed, access speed, and the like, an MRAM having a TMR element using tunneling magneto-resistive effect (TMR) is proposed in place of the GMR-MRAM. The TMR effect is an effect such that the tunnel current passing through an insulating layer changes in accordance with relative angles of the magnetization directions of two ferromagnetic layers sandwiching a very-thin insulating layer (tunnel barrier layer). When the magnetization directions of the two ferromagnetic layers are parallel to each other, the resistance value becomes the minimum. On the contrary, when the magnetization directions are antiparallel to each other, the resistance value becomes the maximum. In the TMR-MRAM, when the TMR element has a configuration of, for example, "CoFe/aluminum oxide/CoFe", the resistance change ratio is high as 40% and the resistance value is also large. Consequently, the TMR-MRAM can be easily matched with a semiconductor device such as an MOSFET. Therefore, the TMR-MRAM can easily obtain a higher output as compared with the GMR-MRAM, and improvement in storage capacity and access speed is expected. In the TMR-MRAM, a current magnetic field is generated by passing current to a conductor as a write line disposed near the TMR element. By using the current magnetic field, the magnetization direction of the magnetic layer in the TMR element is changed to a predetermined direction, thereby storing information. As a method of reading stored information, a method of passing current in the direction perpendicular to a tunnel barrier layer and detecting a resistance change in the TMR element is known. Such TMR-MRAM techniques are disclosed in U.S. Pat. No. 5,629,922 and Japanese Patent Laid-open No. Hei 9-91949.

Recently, higher packing density of a magnetic memory device is in increasing demand and, accordingly, reduction in the size of the TMR element is also required. As the TMR element is becoming finer, due to the influence of a demagnetizing field generated by magnetic poles at both ends of the TMR element, a stronger magnetic field is required to align the magnetization direction in a magnetic layer (free magnetization direction layer) for storing information to a predetermined direction, and write current necessary at the time of writing information is on increasing trend. To solve the problem, a magnetic memory cell having a closed magnetic circuit layer for forming a closed magnetic circuit in cooperation with the free magnetization direction layer around a conductor (write line) near the TMR element has been proposed (refer to, for example, Japanese Patent Laid-open No. 2001-273759). Since the closed magnetic circuit is constructed by a free magnetization direction layer related to recording, the adverse influence exerted by the demagnetizing field can be avoided and a magnetic memory device of high packing density can be realized. Further, in this case, both of two write lines extend in the closed magnetic circuit, so that magnetization can be efficiently inverted.

However, in the magnetic memory cell having the closed magnetic circuit structure disclosed in Japanese Patent Laid-open No. 2001-273759, the closed magnetic circuit layer and the free magnetization direction layer are in contact with each other. Consequently, selection of a material is constrained since a magnetic connection state has to be considered. There is a possibility that the constraint of selection of a material disturbs improvement in the magnetic characteristic of the TMR element. To address a demand for higher packing density, the write efficiency has to be improved.

SUMMARY OF THE INVENTION

The present invention has been achieved in consideration of such problems and its object is to provide a magneto-resistive element, a magnetic memory cell, and a magnetic memory device to which information can be stably written by efficiently using a magnetic field generated by current flowing in a conductor (write line) and which have a high degree of flexibility in designing.

A magneto-resistive element according to the invention has: a magnetic yoke disposed annularly, in a partial region along an extension direction of a conductor, in a circumferential direction so as to surround the conductor, and having a pair of open ends facing each other while sandwiching a gap provided in a part in the circumferential direction; and a stacked body including a magneto-sensitive layer of which magnetization direction changes according to an external magnetic field and a pair of end faces, and the stacked body is disposed in the gap so that each of the pair of end faces and each of the pair of open ends face each other. The phrase "facing each other" denotes here a state where members face each other without direction contact with each other and without electric connection to each other.

A magnetic memory cell according to the invention is a magnetic memory cell having a pair of magneto-resistive elements. Each of the magneto-resistive elements has: a magnetic yoke disposed annularly, in a partial region along an extension direction of a conductor, in a circumferential direction so as to surround the conductor, and having a pair of open ends facing each other while sandwiching a gap provided in a part in the circumferential direction; and a stacked body including a magneto-sensitive layer of which magnetization direction changes according to an external magnetic field and a pair of end faces. The stacked body is disposed in the gap so that each of the pair of end faces and each of the pair of open ends face each other.

A magnetic memory device according to the invention has: a first write line; a second write line extended so as to cross the first write line and, in a portion corresponding to an area of intersection with the first write line, extended parallel to the first write line; and a magnetic memory cell including a pair of magneto-resistive elements. Each of the pair of magneto-resistive elements has: a magnetic yoke disposed annularly, in a partial region along an extension direction of the first and second write lines, in a circumferential direction so as to surround the first and second write lines, and having a pair of open ends facing each other while sandwiching a gap provided in a part in the circumferential direction; and a stacked body including a magneto-sensitive layer of which magnetization direction changes according to an external magnetic field and a pair of end faces, and the stacked body is disposed in the gap so that each of the pair of end faces and each of the pair of open ends face each other.

In the magneto-resistive element, the magnetic memory cell, and the magnetic memory device according to the invention, the magnetization of the magneto-sensitive layer is inverted efficiently and, as compared with the case where the stacked body and the magnetic yoke are in contact with each other, the material of the stacked body can be selected from a wider range.

In the magneto-resistive element, the magnetic memory cell, and the magnetic memory device according to the invention, preferably, an insulating layer is provided between each of the pair of end faces and each of the pair of open ends. It is also preferable that the area of a cross section orthogonal to the circumferential direction, of the magnetic yoke be the smallest at the pair of open ends.

In the magneto-resistive element, the magnetic memory cell, and the magnetic memory device according to the invention, the magnetic yoke includes: a pair of facing yokes extending in a direction apart from the pair of open ends and facing each other while sandwiching the gap; a pair of pillar yokes each connected to one end on the side opposite to the open end, of each of the pair of facing yokes and extending in the layer stack direction of the stacked body while facing each other; and a beam yoke connected to one end on the side opposite to the pair of facing yokes, of each of the pair of pillar yokes. The pair of magneto-resistive elements can be constructed so as to share at least one of the pair of pillar yokes. In this case, it is preferable to provide the magneto-sensitive layer at the same level as that of the pair of facing yokes.

Since each of the magneto-resistive element, the magnetic memory cell, and the magnetic memory device according to the invention has a magnetic yoke disposed annularly, in a partial region along the extension direction of a conductor (first and second write lines), in a circumferential direction so as to surround the conductor (first and second write lines), and having a pair of open ends facing each other while sandwiching a gap provided in a part in the circumferential direction; and a stacked body including a magneto-sensitive layer of which magnetization direction changes according to an external magnetic field and a pair of end faces. The stacked body is disposed in the gap so that each of the pair of end faces and each of the pair of open ends face each other. With the configuration, magnetization of the magneto-sensitive layer can be efficiently inverted and, as compared with the case where the stacked body and the magnetic yoke are in contact with each other, the material of the stacked body can be selected from a wider range and the magnetic and electric performances of the stacked body can be sufficiently displayed.

Other and further objects, features and advantages of the invention will appear more fully from the following description.

DETAILED DESCRIPTION OF THE PREFERRED EMBODIMENTS

Figure 1:
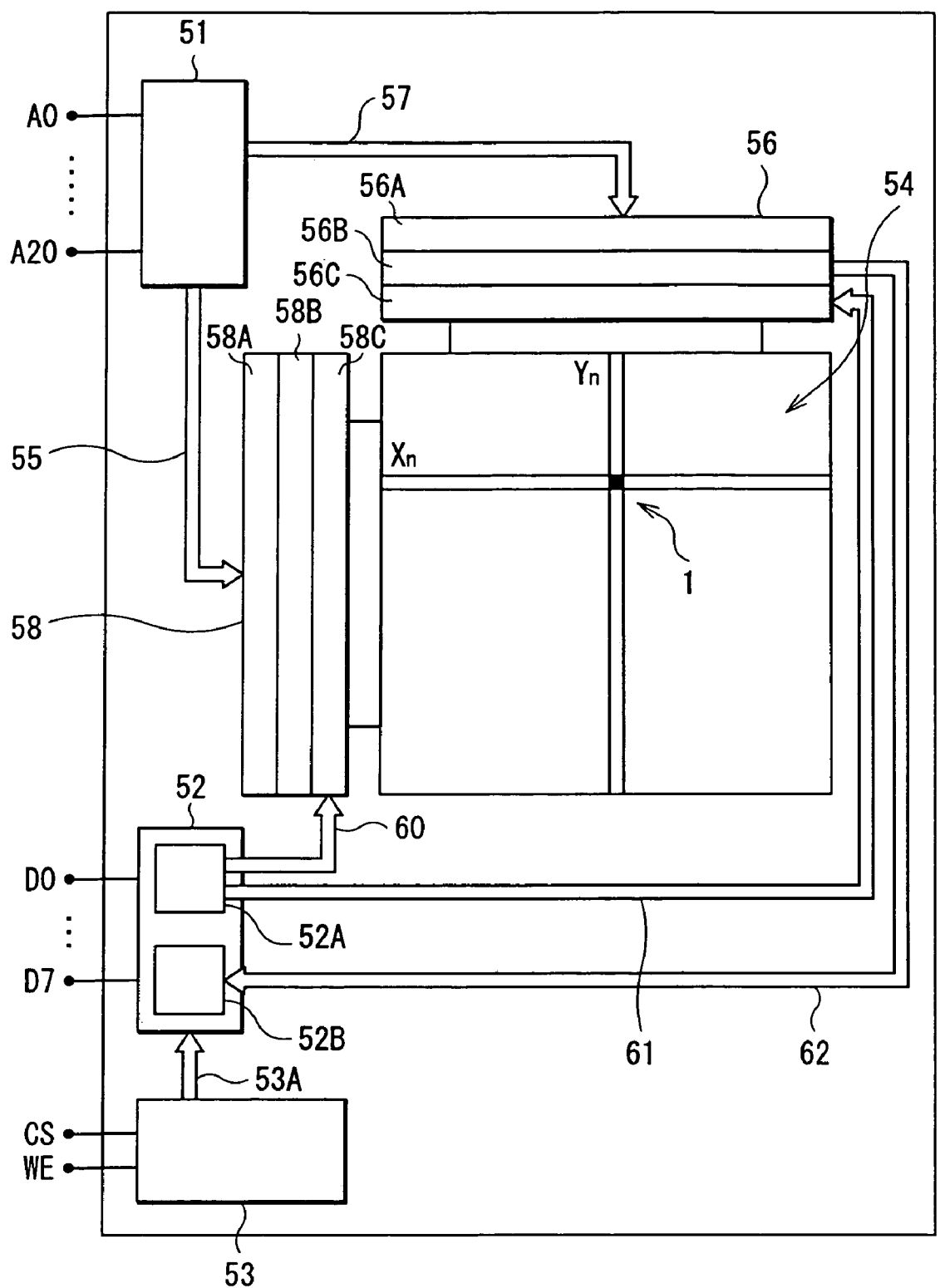
FIG. 1 is a block diagram showing a general configuration of a magnetic memory device according to an embodiment of the invention.

An embodiment of the invention will be described in detail hereinbelow by referring to the drawings.

First, by referring to FIGS. 1 to 9, the configuration of a magnetic memory device according to an embodiment of the invention will be described. FIG. 1 is a conceptual diagram showing a general configuration of a magnetic memory device in the embodiment. The magnetic memory device of the embodiment has an address buffer 51, a data buffer 52, a control logic part 53, a memory cell group 54, a first drive control circuit part 56, a second drive control circuit part 58, external address input terminals A0 to A20, and external data terminals D0 to D7.

The memory cell group 54 has a matrix structure in which a number of memory cells 1 each having a pair of tunneling magneto-resistive elements (hereinbelow, called TMR elements) are arranged in a word line direction (X-direction) and a bit line direction (Y-direction) which are orthogonal to each other. The memory cell 1 is the minimum unit for storing data in the magnetic memory device and is a concrete example corresponding to a "magnetic memory cell" in the invention. The memory cell 1 will be described in detail later.

The first drive control circuit part 56 has an address decoder circuit 56A, a sense amplification circuit 56B, and a current drive circuit 56C in the Y-direction. The second drive control circuit part 58 has an address decoder circuit 58A, a constant current circuit 58B, and a current drive circuit 58C in the X-direction.

The address decoder circuits 56A and 58A are to select a word decode line 72 (which will be described later) and a bit decode line 71 (which will be described later) according to an input address signal. The Y-direction sense amplification circuit 56B and the X-direction constant current circuit 58B are circuits driven at the time of performing reading operation. The Y-direction and X-direction current drive circuits 56C and 58C are circuits driven at the time of performing writing operation.

The Y-direction sense amplification circuit 56B and the memory cell group 54 are connected to each other via a plurality of bit decode lines 71 in which the sense current flows at the time of reading operation. Similarly, the X-direction constant current circuit 58B and the memory cell group 54 are connected to each other via a plurality of word decode lines 72 in which the sense current flows at the time of reading operation.

The Y-direction current drive circuit 56C and the memory cell group 54 are connected to each other via write bit lines 5 (which will be described later) necessary at the time of writing operation. Similarly, the X-direction current drive circuit 58C and the memory cell group 54 are connected to each other via write word lines 6 (which will be described later) necessary at the time of writing operation.

The address buffer 51 has the external address input terminals A0 to A20 and is connected to the Y-direction address decoder circuit 56A in the first drive control circuit part 56 via a Y-direction address line 57 and to the X-direction address decoder circuit 58A in the second drive control circuit part 58 via an X-direction address line 55. The address buffer 51 receives an address signal from the outside via the external address input terminals A0 to A20 and amplifies the address signal to a voltage level required in the Y-direction address decoder circuit 56A and the X-direction address decoder circuit 58A by a buffer amplifier (not shown) provided in the address buffer 51. Further, the address buffer 51 functions to divide the amplified address signal into two signals and output the signals to the Y-direction address decoder circuit 56A via the Y-direction address line 57 and to the X-direction address decoder circuit 58A via the X-direction address line 55.

The data buffer 52 is constructed by an input buffer 52A and an output buffer 52B, has the external data terminals D0 to D7, is connected to the control logic part 53, and operates by an output control signal 53A from the control logic part 53. The input buffer 52A is connected to the Y-direction current drive circuit 56C in the first drive control circuit part 56 and the X-direction current drive circuit 58C in the second drive control circuit part 58 via a Y-direction write data bus 61 and an X-direction write data bus 60, respectively. At the time of performing an operation of writing data to the memory cell group 54, the input buffer 52A functions to receive signal voltages of the external data terminals D0 to D7, amplify the signal voltage to a required voltage level by an internal buffer amplifier (not shown), and transmit the resultant voltage to the X-direction current drive circuit 58C and the Y-direction current drive circuit 56C via the X-direction write data bus 60 and the Y-direction write data bus 61, respectively. The output buffer 52B is connected to the sense amplification circuit 56B via a Y-direction read data bus 62. At the time of reading an information signal stored in the memory cell group 54, the output buffer 52B functions to amplify the information signal supplied from the sense amplification circuit 56B by an internally provided buffer amplifier (not shown) and to output the resultant signal with low impedance to the external data terminals D0 to D7.

The control logic part 53 has a chip select terminal CS and a write enable terminal WE and is connected to the data buffer 52. The control logic part 53 functions to receive a signal voltage from the chip select terminal CS for selecting a memory cell to be subject to reading/writing from the group 54 of memory cells and a signal voltage from the write enable terminal WE for outputting a write permit signal and to output the output control signal 53A to the data buffer 52.

The configuration related to information writing operation in the magnetic memory device shown in FIG. 1 will now be described.

Figure 2:
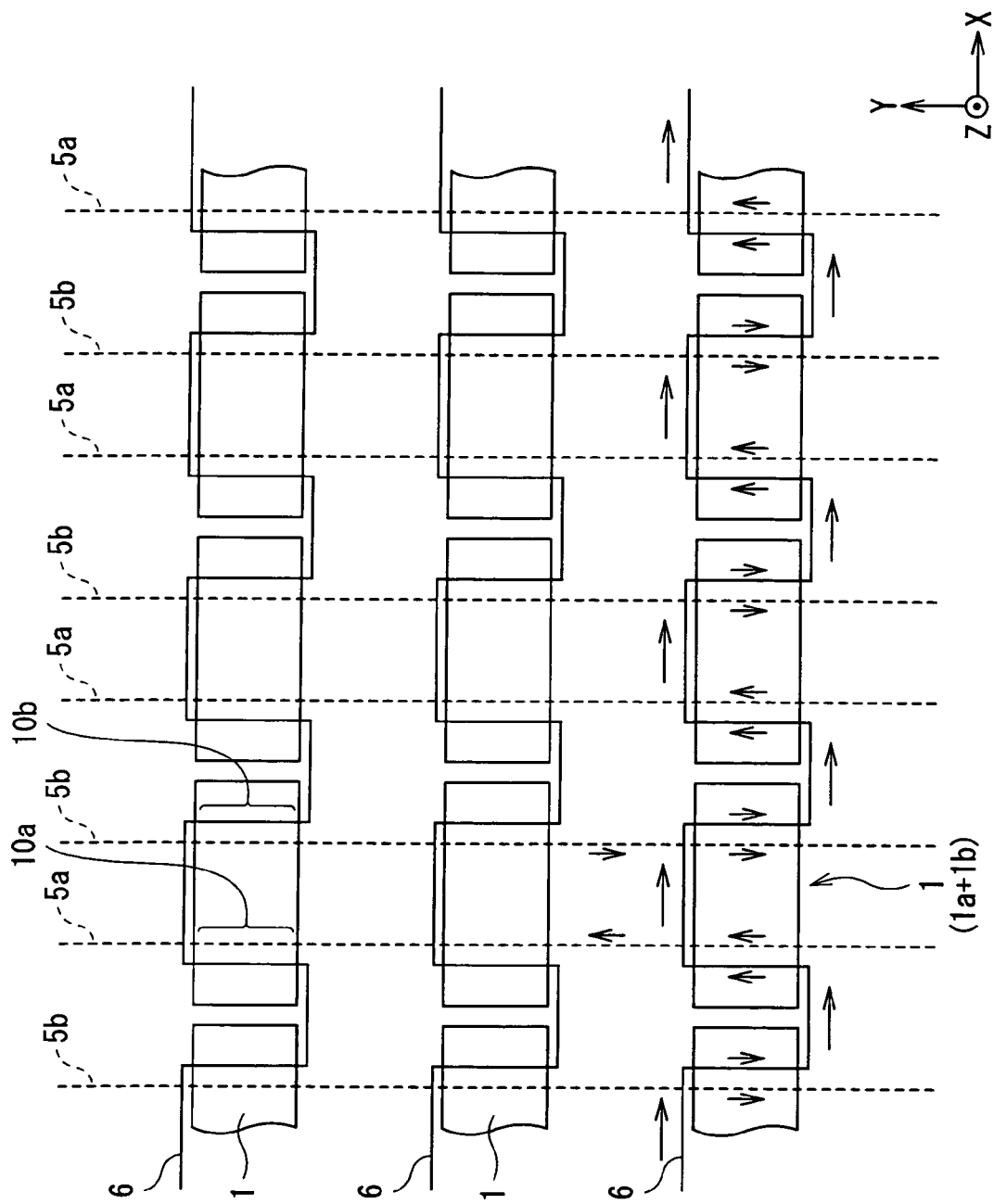
FIG. 2 is a plan view showing the configuration of a write line of the magnetic memory device illustrated in FIG. 1.

FIG. 2 is a conceptual diagram showing a configuration in plan view of a main part related to the writing operation in the memory cell group 54. As shown in FIG. 2, the magnetic memory device of the embodiment includes a plurality of write bit lines 5a and 5b and a plurality of write word lines 6 extending so as to cross the plurality of write bit lines 5a and 5b. Each region where the write bit lines 5a and 5b and the write word line 6 cross each other includes a parallel part 10a in which the write bit line 5a and the write word line 6 extend parallel with each other and a parallel part 10b in which the write bit line 5b and the write word line 6 extend parallel with each other. Concretely, as shown in FIG. 2, the write word lines 6 extend in the X-direction in a rectangular wave shape and the write bit lines 5a and 5b extend in the Y-direction alternately and linearly. The rising and falling portions of the rectangular wave shape of the write word lines 6 form the plurality of parallel parts 10a and 10b in cooperation with the write bit lines 5a and 5b. The memory cell 1 is provided in each of the regions where the write bit lines 5a and 5b cross the write word line 6 so as to include at least a part of the parallel parts 10a and 10b. The memory cell 1 is constructed by TMR elements 1a and 1b, the TMR element 1a is provided in a region where the write bit line 5a and the write word line 6 cross each other, and the other TMR element 1b is provided in the region where the write bit line 5b and the write word line 6 cross each other. The TMR elements 1a and 1b are a concrete example of "a pair of magneto-resistive elements" of the invention.

To the write bit lines 5a and 5b and the write word line 6, currents from the Y-direction current drive circuit 56C and the X-direction current drive circuit 58C flow. The current flowing in the write bit line 5a and the current flowing in the write bit line 5b are always in the opposite directions. For example, as shown by the arrows in FIG. 2, when the current direction in the write bit lines 5a is set as +Y direction, the current direction in the write bit lines 5b is −Y direction. Therefore, in this case, when the current directions in the write word lines 6 are set as +X direction as a whole (from left to right in the drawing sheet), the direction of current in the write bit line 5a and that in the write word line 6 in the TMR element 1a are parallel with each other. The direction of current in the write bit line 5b and that in the write word line 6 flowing in the other TMR element 1b are also parallel with each other. In the following, if it is unnecessary to discriminate the current directions from each other, the write bit lines 5a and 5b will be simply referred to as the write bit lines 5. The write word line 6 is a concrete example corresponding to a "first write line" of the invention, and the write bit line 5 is a concrete example corresponding to a "second write line" of the invention.

Figure 3:
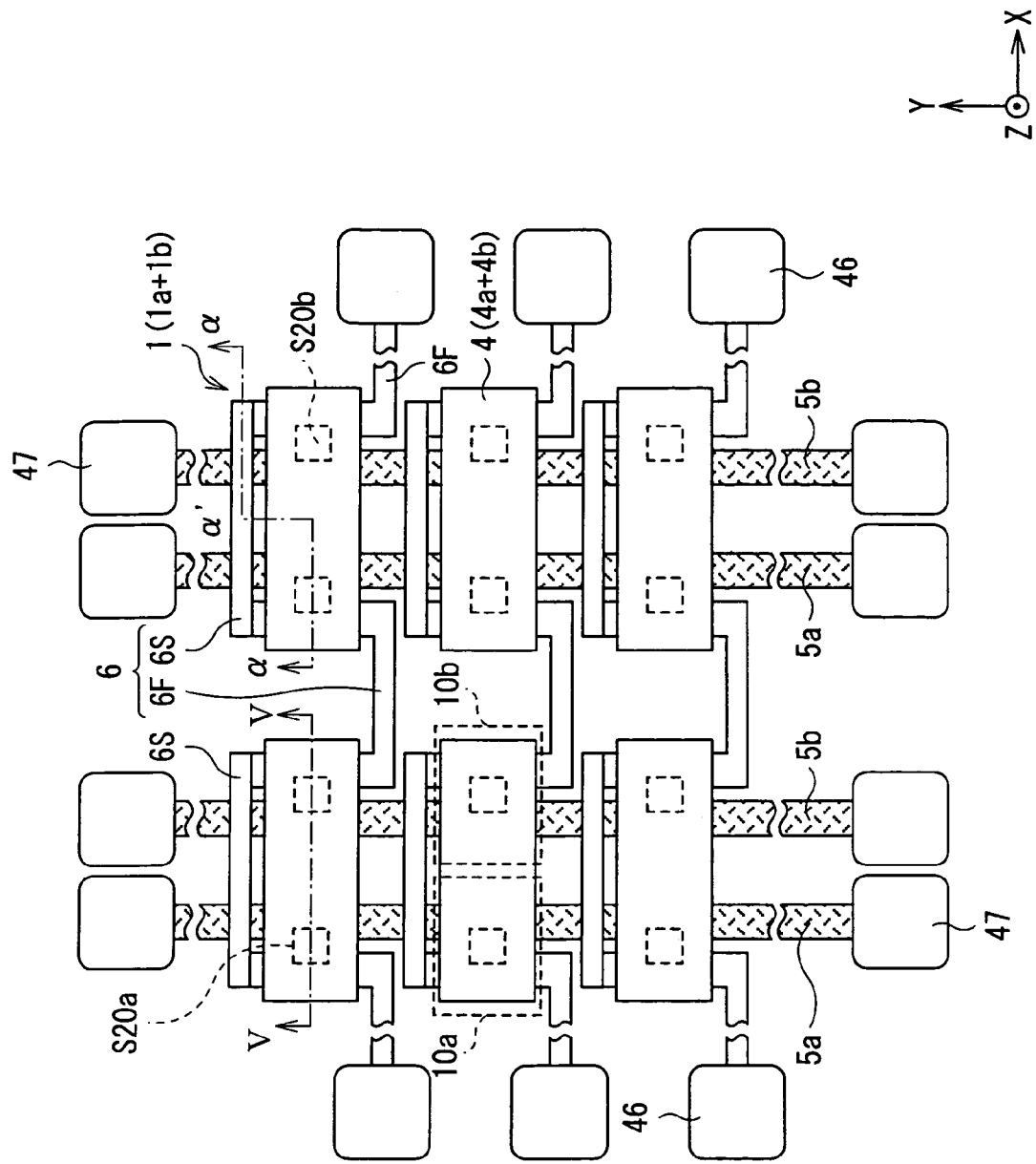
FIG. 3 is a partial plan view showing the configuration of a main part of a memory cell group in the magnetic memory device illustrated in FIG. 1.

FIG. 3 shows the configuration in plan view of the main part of the memory cell group 54 more specifically. The write bit lines 5a and 5b, write word lines 6, and memory cells 1 (TMR elements 1a and 1b) shown in FIG. 3 correspond to those in FIG. 2. The TMR elements 1a and 1b are disposed in the parallel parts 10a and 10b of the write bit lines 5a and 5b and the write word lines 6. The TMR elements 1a and 1b have stacked bodies S20a and S20b each including a magneto-sensitive layer and the magnetic yokes 4a and 4b, respectively, and the magnetization direction of the magneto-sensitive layer changes according to the magnetic field generated by the currents flowing in the write bit lines 5a and 5b and the write word lines 6 in the parallel parts 10a and 10b (that is, the external magnetic field in the magnetic yokes 4a and 4b). The write word line 6 includes two parts of a part of a first level 6F provided in the same layer (first level L1 which will be described later) as that of the write bit lines 5a and 5b and a part of a second level 6S which is different from the part of the first level 6F and is formed in the second level L2 (to described later). The parts of the first and second levels 6F and 6S are electrically connected to each other via a connection layer 6T (which will be described later) made of a conductive material such as aluminum (Al) or copper (Cu). With the configuration, the write word line 6 extends in the X-direction over the write bit lines 5a and 5b extending in the Y-direction and functions as a single conductive line extending in the X-direction as a whole. In this case, the write bit lines 5a and 5b and the part of the first level 6F are provided in the first level L1 in the parallel parts 10a and 10b and are electrically insulated from each other.

At both ends of each write bit line 5, write bit line lead electrodes 47 are provided. One of the write bit line lead electrodes 47 is connected to the Y-direction current drive circuit 56C and the other one is connected so as to be finally grounded. Similarly, write word line lead electrodes 46 are provided at both ends of each write word line 6. One of the write word line lead electrodes 46 is connected to the X-direction current drive circuit 58C and the other one is connected so as to be finally grounded.

Figure 4:
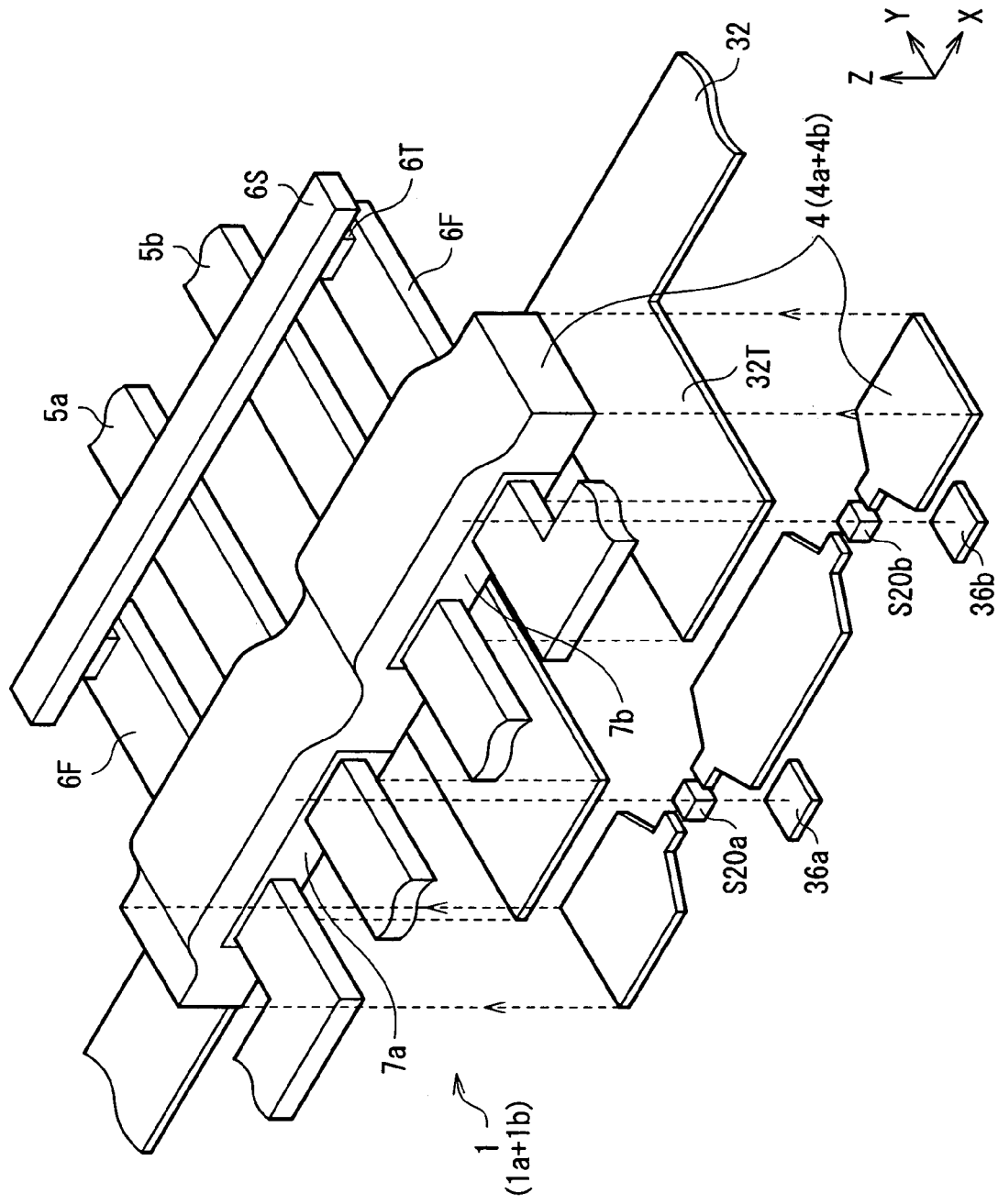
FIG. 4 is a perspective view showing the configuration of a main part of the memory cell group in the magnetic memory device illustrated in FIG. 1.
Figure 5:
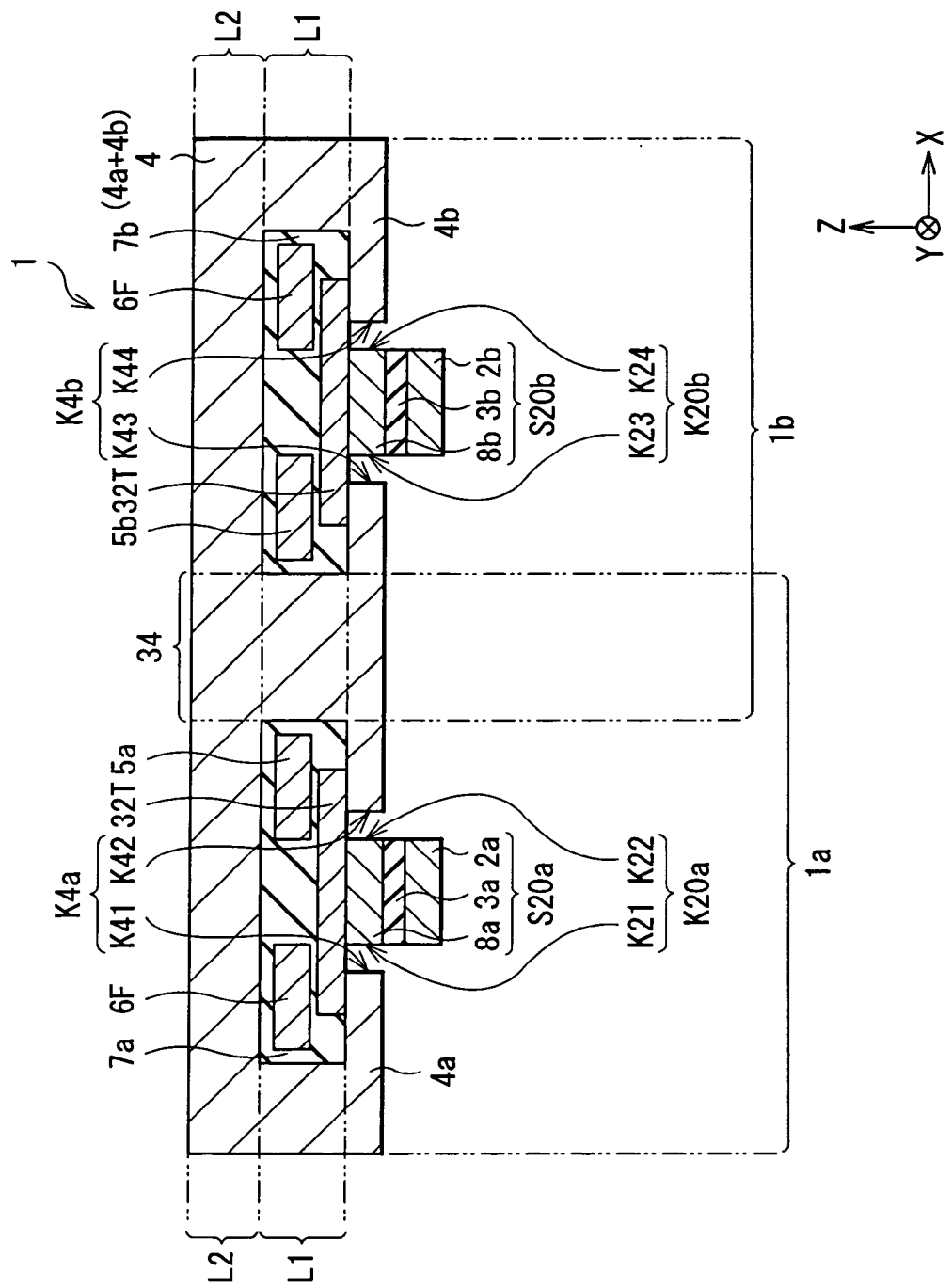
FIG. 5 is a cross section showing the configuration of a plane taken along line V—V of the magnetic memory cell illustrated in FIG. 3.
Figure 6:
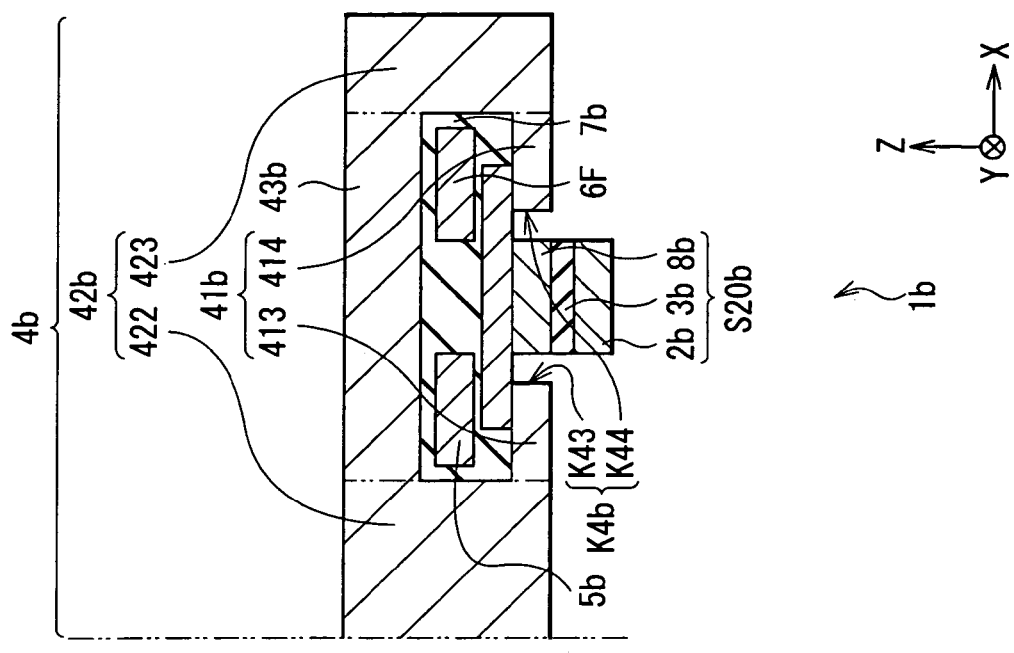
FIG. 6 is a cross section showing that the magnetic memory cell in FIG. 5 is conceptually divided into two TMR elements.
Figure 6:
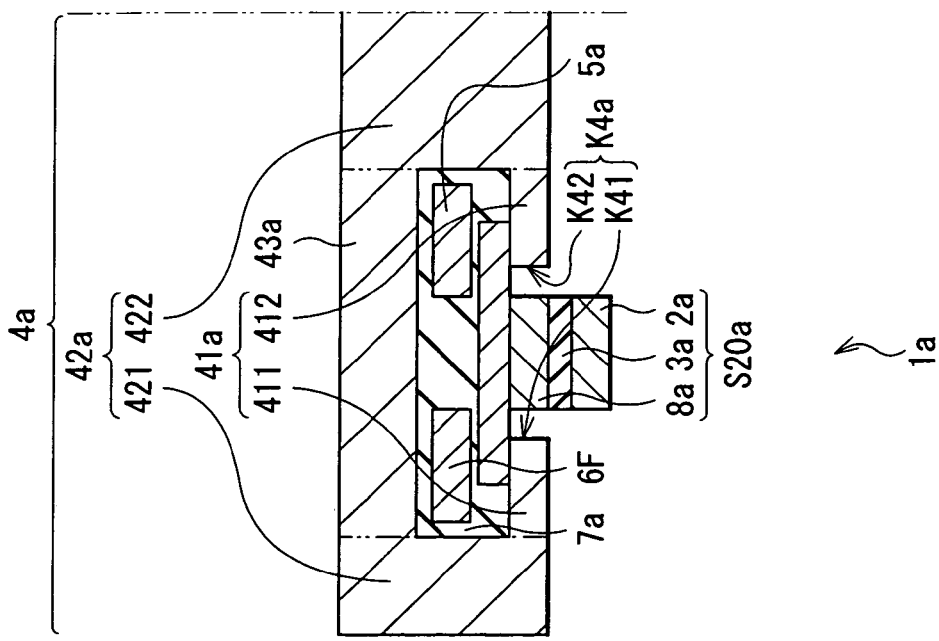

FIG. 4 is an enlarged perspective view of the memory cell 1. FIG. 5 shows a schematic sectional configuration of the memory cell 1, which is taken along line V—V of FIG. 3. FIG. 6 shows that the memory cell 1 in FIG. 5 is conceptually divided into the TMR elements 1a and 1b. FIGS. 5 and 6 are schematic views for clarifying the detailed configuration. The size ratio and shape of the memory cell 1 in FIGS. 5 and 6 do not always coincide with those of FIG. 4.

As shown in FIGS. 4 to 6, the memory cell 1 has the pair of TMR elements 1a and 1b having magnetic yokes 4a and 4b and stacked bodies S20a and S20b, respectively. The write bit lines 5a and 5b and the write word line 6 (part of first level 6F) are arranged so as to be adjacent to each other in the first level L1 parallel with the layer stack face of the stacked bodies S20a and S20b in a region surrounded by the magnetic yokes 4a and 4b (FIG. 5). The write word line 6 (part of first level 6F), write bit lines 5a and 5b and magnetic yokes 4a and 4b are electrically insulated from each other via insulating films 7a and 7b. The stacked body S20a is disposed in a gap in the magnetic yoke 4a so that a pair of end faces K20a (K21 and K22) face a pair of open ends K4a (K41 and K42). Between the pair of end faces K20a and the pair of open ends K4a, an insulating layer (not shown) made of, for example, aluminum oxide ($Al_2O_3$) is formed. Similarly, the stacked body S20b is disposed in a gap in the magnetic yoke 4b so that a pair of end faces K20b (K23 and K24) face a pair of open ends K4b (K43 and K44). Between the pair of end faces K20b and the pair of open ends K4b, an insulating layer (not shown) made of, for example, aluminum oxide ($Al_2O_3$) is formed. The pair of stacked bodies S20a and S20b is sandwiched between a projection 32T and conductive layers 36a and 36b (which will be described later) and is electrically connected to the conductive layers 36a and 36b in the layer stack direction (Z direction). The pair of conductive layers 36a and 36b is a part of a pair of Schottky diodes 75a and 75b (which will be described later) and the other ends of the Schottky diodes 75a and 75b are connected to read bit lines 33a and 33b (which will be described later) extending in the Y-direction. The Schottky diodes 75a and 75b are buried in a substrate 31 (which will be described later). The surface opposite to the surface which is in contact with the pair of conductive layers 36a and 36b, of the stacked bodies S20a and S20b, that is, the surface on the side of the region surrounded by the magnetic yokes 4a and 4b is in contact with the projection 32T extending in the Y-direction. The projection 32T is a part of a read word line 32 extending in the X-direction. Although the projection 32T is in contact with the magnetic yokes 4a and 4b in FIG. 5, they may be electrically insulated from each other via an insulating film. The write word line 6 (part of first level 6F) and the write bit lines 5a and 5b are electrically insulated from the read word line 32 (projection 32T).

The TMR element 1a in the memory cell 1 has: the magnetic yoke 4a disposed in the circumferential direction so as to surround the periphery of the write bit line 5a and the part of the first level 6F in a partial area in the extending direction of the write bit line 5a and the write word line 6, specifically, an area (parallel part 10a) where the write bit line 5a and the write word line 6 extend parallel to each other, and having the pair of open ends K4a (K41 and K42) facing each other over a gap provided in a part of the circumferential direction; and the stacked body S20a including a second magnetic layer 8a as a magneto-sensitive layer of which magnetization direction changes according to an external magnetic field and constructed so that current flows in the direction perpendicular to the stacked face. The pair of open ends K4a is provided so as to face each other over the stacked body S20a in the X-direction. The other TMR element 1b has: the magnetic yoke 4b disposed in the circumferential direction so as to surround the periphery of the write bit line 5b and the part of the first level 6F in a partial area in the extending direction of the write bit line 5b and the write word line 6, specifically, an area (parallel part 10b) where the write bit line 5b and the write word line 6 extend parallel to each other, and having the pair of open ends K4b (K43 and K44) facing each other over a gap provided in a part of the circumferential direction; and the stacked body S20b including a second magnetic layer 8b as a magneto-sensitive layer of which magnetization direction changes according to an external magnetic field and constructed so that current flows in the direction perpendicular to the stacked face. The pair of open ends K4b is provided so as to face each other over the stacked body S20b in the X-direction. The TMR elements 1a and 1b share a common part 34 as a part of the magnetic yokes 4a and 4b.

As shown in FIGS. 5 and 6, the stacked bodies S20a and S20b are TMR films including, in order from the side of the write bit line 5 and the write word line 6, the second magnetic layers 8a and 8b, tunnel barrier layers 3a and 3b, and first magnetic layers 2a and 2b whose magnetization direction is fixed, respectively, and constructed so that current flows in the direction perpendicular to the stack layer face. In FIGS. 5 and 6, to clarify the configuration of the stacked bodies S20a and S20b, the stacked bodies S20a and S20b are exaggerated so as to be larger relative to the peripheral parts.

In the case of inverting the magnetization directions of the second magnetic layers 8a and 8b so as to be antiparallel to each other in the pair of TMR elements 1a and 1b, the directions of return magnetic fields formed so as to pass in the pair of magnetic yokes 4a and 4b by the write bit lines 5a and 5b and the write word line 6 become the same in the common part 34, and the magnetic flux density increases. Consequently, the return magnetic field can be used more efficiently, and the current necessary to invert the magnetization directions of the magnetic yokes 4a and 4b and the second magnetic layers 8a and 8b can be further decreased. Since a part of the magnetic yoke 4 is shared, the pair of TMR elements 1a and 1b can be easily formed, the formation area of the memory cell 1 can be reduced, and capacity of stored information can be increased.

In the stacked bodies S20a and S20b, when a voltage is applied in the direction perpendicular to the layer stack face between the first magnetic layers 2a and 2b and the second magnetic layers 8a and 8b, for example, electrons in the first magnetic layers 2a and 2b pass through the tunnel barrier layers 3a and 3b and move to the second magnetic layers 8a and 8b, and tunnel current flows. The tunnel current changes according to a relative angle between the spin in the first magnetic layers 2a and 2b in the interface with the tunnel barrier layer 3 and the spin in the second magnetic layers 8a and 8b. Specifically, when the spin of the first magnetic layers 2a and 2b and that of the second magnetic layers 8a and 8b are parallel to each other, the resistance value becomes the minimum. When they are antiparallel to each other, the resistance value becomes the maximum. By using the resistance values, the magneto-resistance change ratio (MR ratio) is defined as Equation (1).

$$MR\ \text{ratio} = dR/R \qquad (1)$$

where "dR" denotes the difference between the resistance value in the case where the spins are parallel to each other and that in the case where the spins are antiparallel to each other, and "R" indicates the resistance value in the case where the spins are parallel to each other.

The resistance value against the tunnel current (hereinbelow, called tunnel resistance Rt) strongly depends on the thickness T of the tunnel barrier layer 3. In a low voltage region, as shown in Equation (2), the tunnel resistance Rt exponentially increases with the thickness T of the tunnel barrier layer 3.

$$Rt \propto \exp(2\chi^T) \cdot \chi = \{8\pi^2 m^*(\phi \cdot Ef)^{0.5}\}/h \qquad (2)$$

where $\phi$ denotes the height of the barrier, "m*" denotes effective mass of electrons, "Ef" indicates Fermi energy, and h indicates a Planck's constant. Generally, in a memory element using the TMR element, to match with a semiconductor device such as a transistor, it is said that the proper tunnel resistance Rt is about tens $k\Omega \cdot (\mu m)^2$. However, to realize higher packing density in the magnetic memory device and higher operating speed, the tunnel resistance Rt is set to, preferably, 10 $k\Omega \cdot (\mu m)^2$ or less, more preferably, 1 $k\Omega \cdot (\mu m)^2$ or less. Therefore, to realize the tunnel resistance Rt, it is desirable to set the thickness T of the tunnel barrier layer 3 to 2 nm or less, more preferably, 1.5 nm or less.

By reducing the thickness T of the tunnel barrier layers 3a and 3b, the tunnel resistance Rt can be reduced but on the other hand, a leak current occurs due to roughness of the junction interfaces with the first magnetic layers 2a and 2b and the second magnetic layers 8a and 8b so that the MR ratio deteriorates. To prevent this, the thickness T of the tunnel barrier layers 3a and 3b has to be large to an extent that leak current does not flow. Concretely, the thickness T is desirably 0.3 nm or larger.

Desirably, the stacked bodies S20a and S20b have a coercive force differential structure and the coercive force of the first magnetic layers 2a and 2b is larger than that of the second magnetic layers 8a and 8b. Concretely, the coercive force of the first magnetic layer 2 is preferably larger than $(50/4\pi) \times 10^3$ A/m, more preferably, $(100/4\pi) \times 10^3$ A/m. With the configuration, the magnetization direction of the first magnetic layers 2a and 2b can be prevented from being influenced by unnecessary magnetic fields such as external scattered magnetic fields or the like. The first magnetic layers 2a and 2b are made of, for example, cobalt iron alloy (CoFe) and have a thickness of 5 nm. Alternately, cobalt (Co), cobalt platinum alloy (CoPt), nickel iron cobalt alloy (NiFeCo), or the like can be applied to the first magnetic layers 2a and 2b. The second magnetic layers 8a and 8b are made of, for example, cobalt (Co), cobalt iron alloy (CoFe), cobalt platinum alloy (CoPt), nickel iron alloy (NiFe), or nickel iron cobalt alloy (NiFeCo). The axes of easy magnetization of the first magnetic layers 2a and 2b and the second magnetic layers 8a and 8b are preferably parallel to each other so that the magnetization direction of the first magnetic layers 2a and 2b and that of the second magnetic layers 8a and 8b are stabilized in a parallel or antiparallel state.

The magnetic yokes 4a and 4b extend so as to annularly surround at least a part of the parallel parts 10a and 10b in the write bit lines 5a and 5b and the write word line 6 and are constructed so that a return magnetic field passing in the magnetic yokes 4a and 4b is generated by current flowing in the parallel parts 10a and 10b. More specifically, as shown in FIG. 6, the magnetic yoke 4a includes: a pair of facing yokes 41a (411 and 412) extending from the pair of open ends K4a (K41 and K42) and facing each other while sandwiching a gap; a pair of pillar yokes 42a (421 and 422) connected to one ends on the side opposite to the open ends K41 (K41 and K42), of the pair of facing yokes 41a (411 and 412) and extending in the layer stacking direction (Z direction) of the stacked body S20a while facing each other; and a beam yoke 43a connected to one ends on the side opposite to the pair of facing yokes 41a (411 and 412), of the pair of pillar yokes 42a (421 and 422). It is constructed so that the second magnetic layer 8a in the stacked body S20a is in the same level as that of the pair of facing yokes 41a (411 and 412). The other magnetic yoke 4b includes: a pair of facing yokes 41b (413 and 414) extending from the pair of open ends K4b (K43 and K44) and facing each other while sandwiching a gap; a pair of pillar yokes 42b (422 and 423) connected to one ends on the side opposite to the open ends K4b (K43 and K44), of the pair of facing yokes 41b (413 and 414) and extending in the layer stacking direction (Z direction) of the stacked body S20b while facing each other; and a beam yoke 43b connected to one ends on the side opposite to the pair of facing yokes 41b (413 and 414), of the pair of pillar yokes 42b (422 and 423). It is constructed so that the second magnetic layer 8b in the stacked body S20b is in the same level as that of the pair of facing yokes 41b (413 and 414). The TMR elements 1a and 1b share the pillar yoke 422, and the common part 34 is formed as shown in FIG. 5. The beam yokes 43a and 43b are provided in the second level L2 as that of the part of the second level 6S.

The magnetization direction of each of such magnetic yokes 4a and 4b is inverted by the return magnetic field generated so as to pass the inside of the magnetic yokes 4a and 4b. Accompanying the inversion of the magnetization direction of the magnetic yokes 4a and 4b by the return magnetic field, the magnetization direction of the second magnetic layers 8a and 8b is inverted, so that the second magnetic layers 8a and 8b function as storage layers for storing information. The magnetic yokes 4a and 4b are made of, for example, a metal containing at least one of nickel (Ni), iron (Fe), and cobalt (Co). The area of the cross section orthogonal to the circumference direction in the magnetic yokes 4a and 4b is the smallest in the pair of open ends K4a and K4b. Concretely, for example, as shown in FIG. 4, the width in the Y-direction of the pair of facing yokes 41a and 41b in the magnetic yokes 4a and 4b decreases toward the stacked bodies S20a and S20b and becomes the minimum in the pair of open ends K4a and K4b. With the configuration, write current flows to the write bit lines 5a and 5b and the write word line 6. When the return magnetic field passing through the magnetic yokes 4a and 4b is generated, the highest and stable magnetic flux density can be obtained in the stacked bodies S20a and S20b (particularly, the second magnetic layers 8a and 8b). Thus, writing operation can be performed efficiently and stably even with small write current.

The magnetic permeability of the magnetic yokes 4a and 4b is preferably high to make the return magnetic field generated by the write bit lines 5a and 5b and the write word line 6 concentrated on the magnetic yokes 4a and 4b. To be concrete, the magnetic permeability is 2,000 or higher and, more preferably, 6,000 or higher.

Each of the write bit lines 5a and 5b and the part of the first level 6F has a structure in which a film of titanium (Ti) having a thickness of 10 nm, a film of titanium nitride (TiN) having a thickness of 10 nm, and a film of aluminum (Al) having a thickness of 500 nm are sequentially stacked. The part of the second level 6S and the connection layer 6T are made of the same kind of material as that of the magnetic yokes 4a and 4b, for example, NiFe. The write bit line 5 and the write word line 6 are not limited to the configuration described above but may be made of at least one of, for example, aluminum (Al), copper (Cu), and tungsten (W). The details of the operation of writing information to the memory cell 1 by using the write bit line 5 and the write word line 6 will be described later.

As described above, since the write bit lines 5a and 5b and the write word line 6 are disposed so as to be adjacent to each other in the first level L1 parallel to the layer stack face of the stacked bodies S20a and S20b in the region surrounded by the magnetic yokes 4a and 4gb, the magnetic memory device of the embodiment has a simpler configuration in the layer stacking direction. In addition, the stacked body S20a is disposed in the gap of the magnetic yoke 4a so that the pair of end faces K20a and the pair of open ends K4a face each other and, similarly, the stacked body S20b is disposed in the gap of the magnetic yoke 4b so that the pair of end faces K20b and the pair of open ends K4b face each other. Consequently, it is less subjected to the constraints such as a magnetic coupling state as compared with the case where the stacked body and the magnetic yoke are in contact with each other and the material of the stacked body S20b can be selected from a wide range. Thus, the stacked bodies S20a and S20b fully displaying the magnetic characteristics of the TMR elements 1a and 1b while having the magnetic yokes 4a and 4b as a closed magnetic circuit through which the return magnetic field passes can be obtained.

Figure 7:
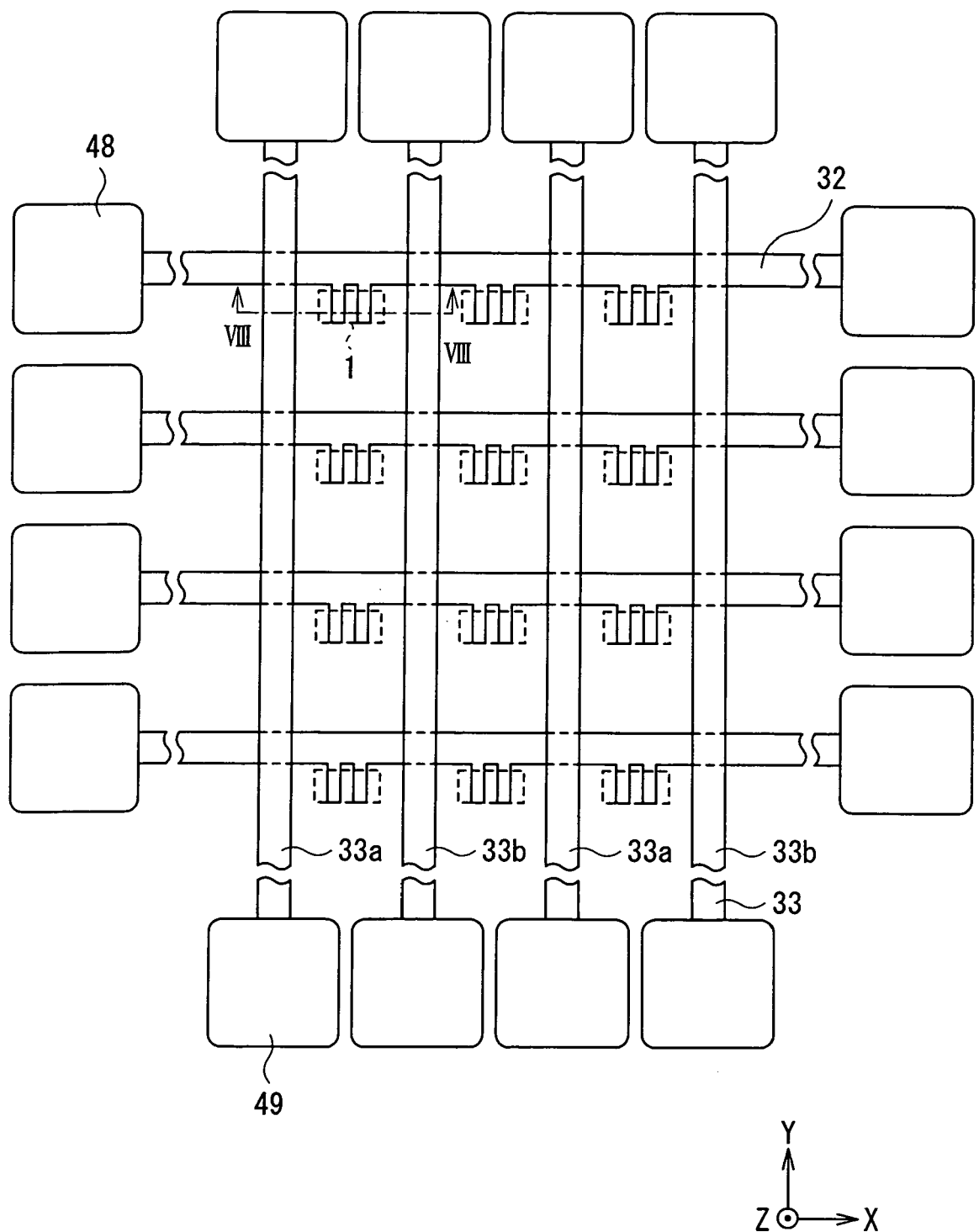
FIG. 7 is another partial plan view showing the configuration of the main part of the memory cell group in the magnetic memory device illustrated in FIG. 1.
Figure 8:
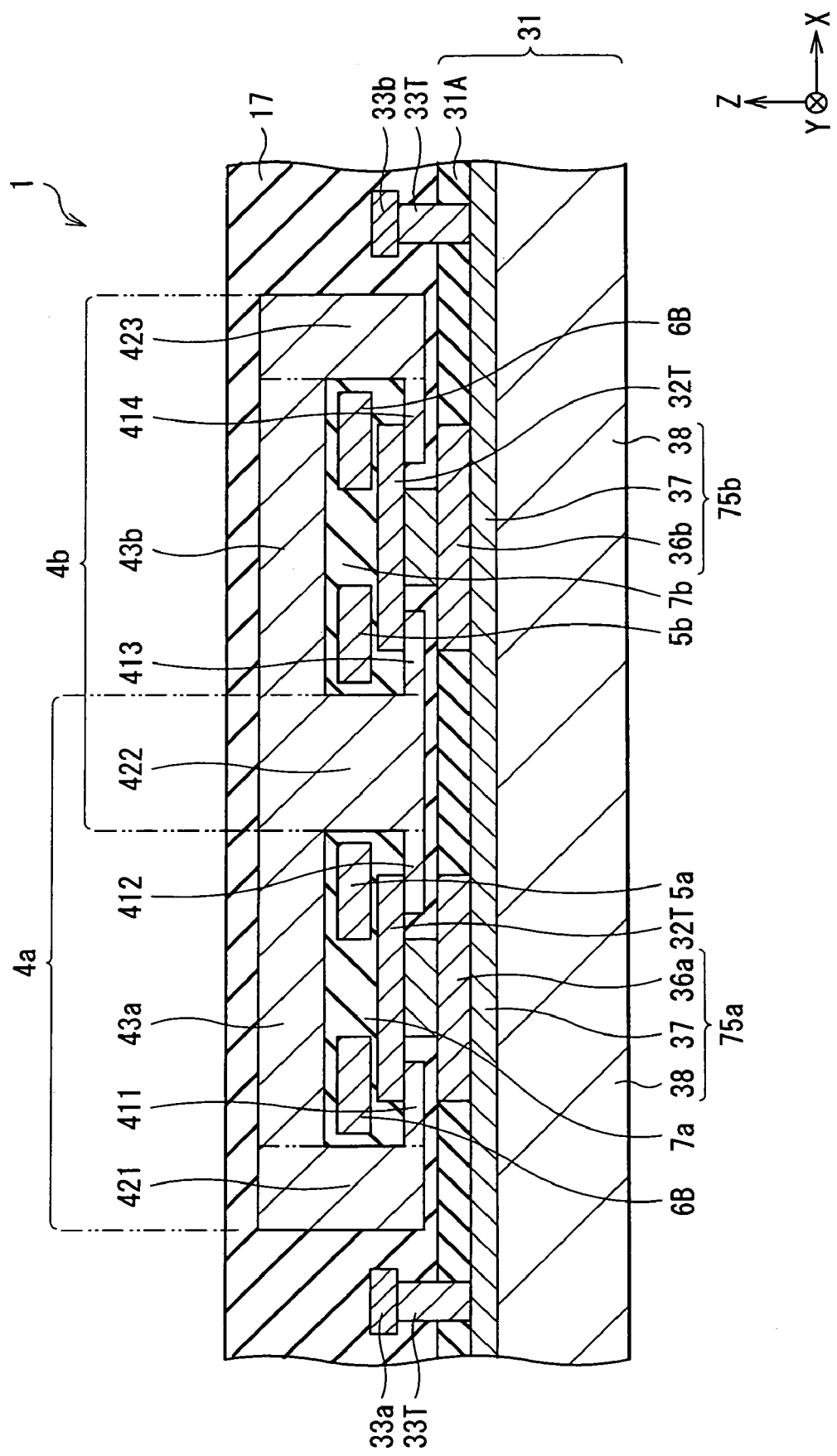
FIG. 8 is a cross section showing the configuration of a plane taken along line VIII—VIII of the memory cell illustrated in FIG. 7.

The configuration related to information reading operation, in the magnetic memory device shown in FIG. 1 will now be described by referring to FIGS. 7 and 8. FIG. 7 is a plan view showing the configuration of a main part related to the reading operation of the memory cell group 54 and corresponds to FIG. 3. FIG. 8 is a cross section taken along line XIII—XIII of FIG. 7.

As shown in FIG. 7, each memory cell 1 is disposed at a position corresponding to each of the intersecting points of the plurality of read word lines 32 and the plurality of read bit lines 33a and 33b in the XY plane. The under face of the stacked bodies S20a and S20b in the memory cell 1 is in contact with the pair of read bit lines 33a and 33b via the pair of Schottky diodes 75a and 75b (hereinbelow, simply called diodes 75a and 75b), and the top face of the stacked bodies S20a and S20b is in contact with the read word line 32. The read bit lines 33a and 33b supply read current to the pair of TMR elements 1a and 1b in each memory cell 1 and the read word line 32 leads the read current passed to the TMR elements 1a and 1b to the ground. At both ends of each read bit line 33, read bit line lead electrodes 49 are provided. On the other hand, at both ends of each read word line 32, read word line lead electrodes 48 are provided.

As shown in FIG. 8, the magnetic memory device of the embodiment is constructed so that, in a region including the memory cell 1, a pair of stacked bodies S20a and S20b and the magnetic yokes 4a and 4b each having a pair of open ends facing each other while sandwiching the stacked body are formed over the substrate 31 provided with the pair of diodes 75a and 75b functioning as a rectifier.

The pair of diodes 75a and 75b have the conductive layers 36a and 36b, an epitaxial layer 37, and a substrate 38 in order from the side of the stacked bodies S20a and S20b. Between the conductive layers 36a and 36b and the epitaxial layer 37, a Schottky barrier is formed. The conductive layers 36a and 36b are in contact with the stacked bodies S20a and S20b in a part of the face opposite to the epitaxial layer 37, and the other part is surrounded by insulating layers 31A and 17. The diodes 75a and 75b do not have parts electrically connected to each other except for connection to the magnetic layers 4a and 4b while sandwiching the stacked bodies S20a and S20b. The substrate 38 is an n type silicon wafer. Generally, in the n type silicon wafer, an impurity of phosphorus (P) is diffused. As the substrate 38, a wafer of an $n^{++}$ type obtained by being highly doped with phosphorus is used. As the epitaxial layer 37, a wafer of the $n^-$ type obtained by being lightly doped with phosphorus is used. By making the epitaxial layer 37 as an $n^-$ type semiconductor and the conductive layers 36a and 36b made of a metal come into contact with each other, a band gap is created and a Schottky barrier is formed. Further, the pair of diodes 75a and 75b is connected to the read bit lines 33a and 33b, respectively, via a connection layer 33T.

Figure 9:
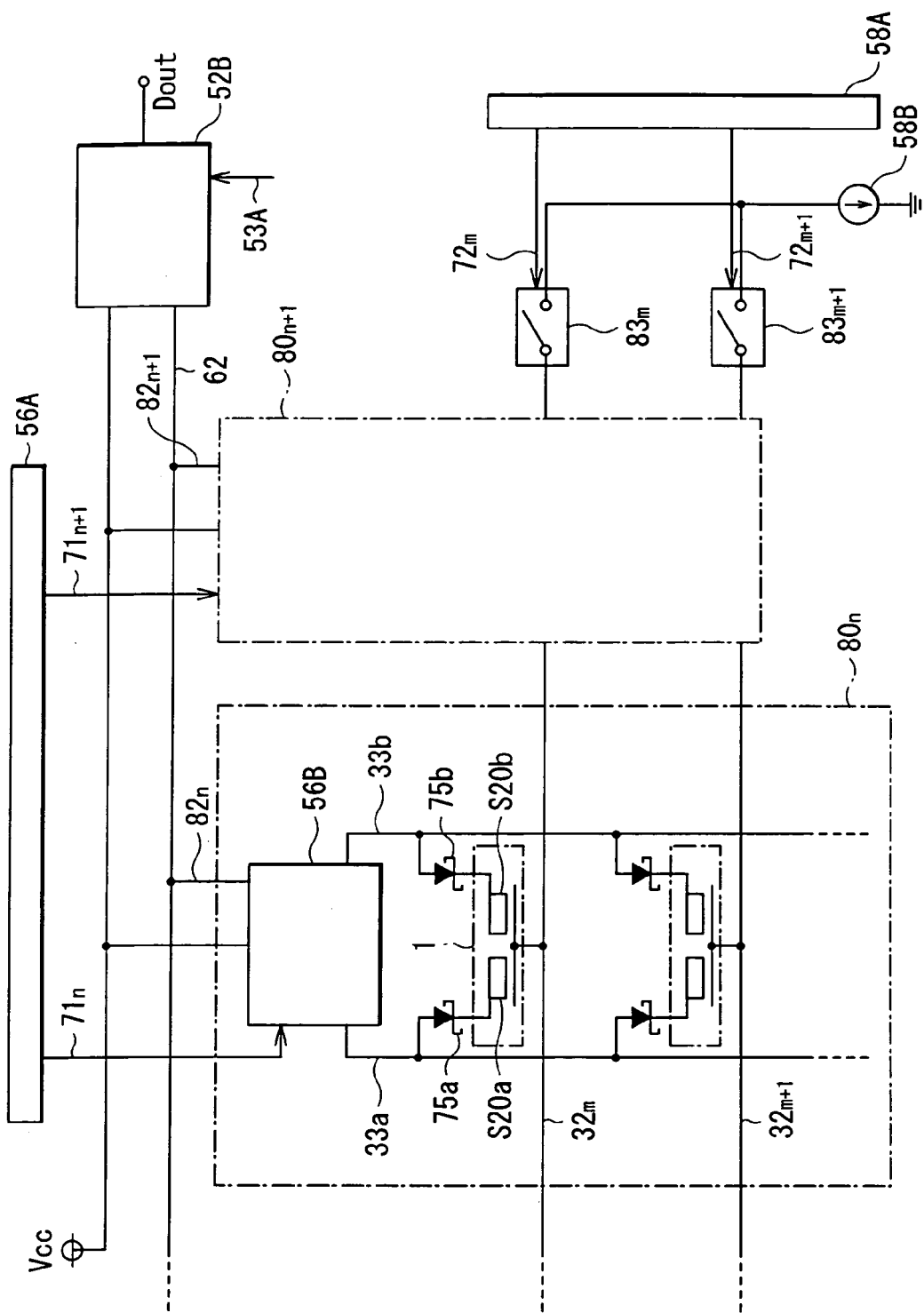
FIG. 9 is a circuit diagram showing the circuit configuration of the magnetic memory device illustrated in FIG. 1.

Referring now to FIG. 9, the circuit configuration related to the reading operation in the magnetic memory device of the embodiment will be described.

FIG. 9 is a configuration diagram of a circuit system constructed by the memory cell group 54 and a read circuit. In the read circuit system, the memory cell 1 is of a differential amplifier type constructed by the pair of TMR elements 1a and 1b. Information in the memory cell 1 is read by outputting a differential value of read currents passed to the TMR elements 1a and 1b (currents passed from the read bit lines 33a and 33b to the TMR elements 1a and 1b and output to the common read word line 32).

In FIG. 9, a unit read circuit 80 ( . . . , 80n, 80n+1, . . . ) as a unit of repetition of the read circuit is constructed by the memory cells 1 of each bit line in the memory cell group 54 and a part of the read circuit including the sense amplification circuit 56B, and the unit read circuits 80n are arranged in the bit line direction. Each of the unit read circuits 80n is connected to the Y-direction address decoder circuit 56A via the bit decode line 71 ( . . . , 71n, 71n+1, . . . ) and is connected to the output buffer 52B via the Y-direction read data bus 62.

In the memory cell group 54, the read word lines 32 ( . . . , 32m, 32m+1, . . . ) arranged in the X-direction and the pair of read bit lines 33a and 33b arranged in the Y-direction are disposed in a matrix. Each of the memory cells 1 is disposed at a position intersecting with the read word line 32 in a region sandwiched by the pair of read bit lines 33a and 33b. One ends of the TMR elements 1a and 1b in each memory cell 1 are connected to the read bit lines 33a and 33b via the pair of diodes 75a and 75b, respectively, and the other ends are connected to the common read word line 32.

One end of each read word line 32 is connected to a read switch 83 ( . . . , $83_m$, $83_{m+1}$, . . . ) via the read word line lead electrode 48 and is also connected to a common X-direction constant current circuit 58B. Each read switch 83 is connected to the X-direction address decoder circuit 58A via the word decode line 72 ( . . . , $72_m$, $72_{m+1}$, . . . ). The read switch 83 is made conductive when a selection signal from the X-direction address decoder circuit 58A is supplied. The X-direction constant current circuit 58B has the function of making the current flowing in the read word line 32 constant.

One end of each read bit line 33 is connected to the Y-direction sense amplification circuit 56B via the read bit line lead electrode 49, and the other end is finally grounded. One Y-direction sense amplification circuit 56B is provided per unit read circuit 80 and has the function of receiving the potential difference between the pair of read bit lines 33a and 33b in each unit read circuit 80 and amplifying the potential difference. The Y-direction sense amplification circuit 56B is connected to the output line 82 ( . . . , 82n, 82n+1, . . . ) and is finally connected to the output buffer 52B via the Y-direction read data bus 62.

The operation in the magnetic memory device of the embodiment will now be described.

Figure 10A:
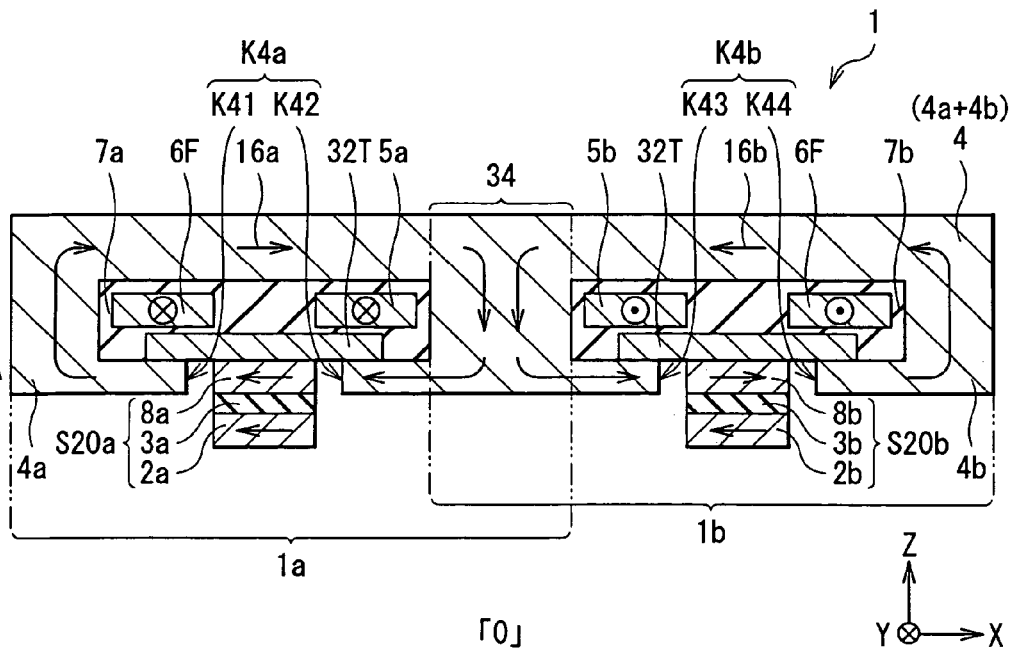
FIG. 10A is a first explanatory diagram showing the relation between a write current direction and a return magnetic field direction (magnetization direction) in the cross-sectional configuration of the magnetic memory cell illustrated in FIG. 5.
Figure 10B:
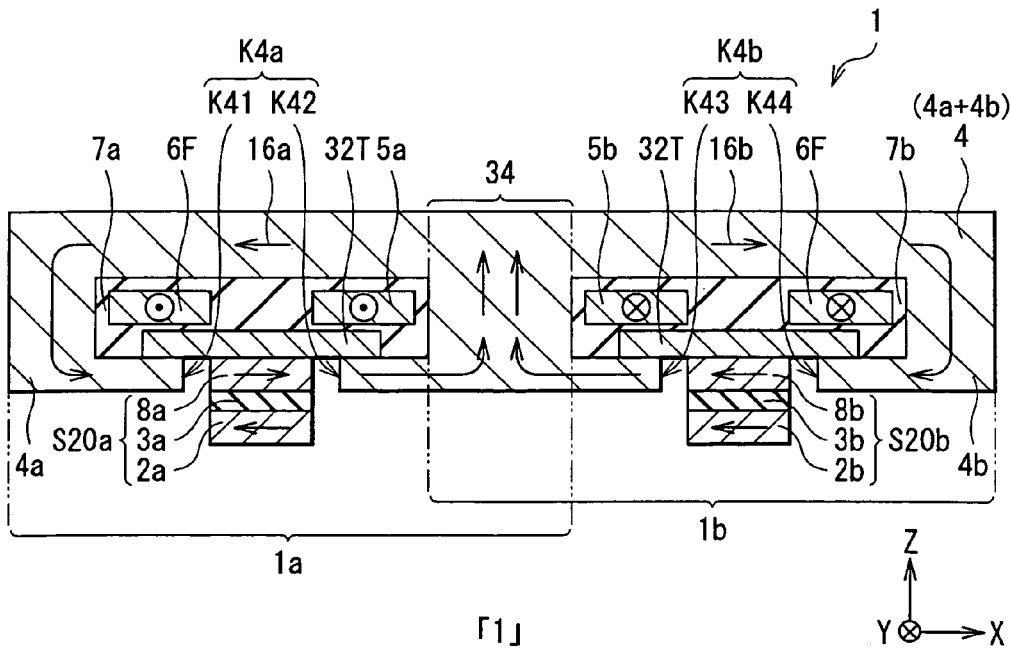
FIG. 10B is a second explanatory diagram showing the relation between the write current direction and the return magnetic field direction (magnetization direction) in the cross-sectional configuration of the magnetic memory cell illustrated in FIG. 5.

First, by referring to FIG. 2 and FIGS. 10A and 10B, the operation of writing information in the memory cell 1 will be described. FIGS. 10A and 10B express the relation between the write current direction and the return magnetic field direction (magnetization direction) in the cross-sectional configuration of the memory cell 1 shown in FIG. 5. The arrows indicated in magnetic layers in FIGS. 10A and 10B indicate the magnetization directions of the magnetic layers. With respect to the magnetic yokes 4a and 4b, the magnetic field directions of a magnetic path formed on the inside are also shown. The magnetization of the first magnetic layers 2a and 2b is fixed to the −X direction. FIGS. 10A and 10B show the case where write current flows in the same direction to the write bit line 5 and the part of the first level 6F which extend in the memory cell 1 and are parallel to each other. FIG. 10A corresponds to the write current direction shown in FIG. 2. FIG. 10A shows a case where write current flows from this side to the depth in the direction perpendicular to the drawing sheet (to the +Y direction) in the TMR element 1a, a return magnetic field 16a is generated in the clockwise direction so as to pass the inside of the magnetic yoke 4a surrounding the write bit line 5a and the part of the first level 6F, write current flows from the depth to this in the direction perpendicular to the drawing sheet side (to the −Y direction) in the TMR element 1b, and a return magnetic field 16b is generated in the counterclockwise direction so as to pass the inside of the magnetic yoke 4b surrounding the write bit line 5b and the part of the first level 6F. In this case, the magnetization direction of the second magnetic layer 8a is the −X direction and the magnetization direction of the second magnetic layer 8b is the +X direction. FIG. 10B corresponds to the case where the directions of current flowing in the write bit line 5 and the part of the first level 6F are opposite to those shown in FIG. 10A. Specifically, FIG. 10B shows a case where write current flows from the depth to this side in the direction perpendicular to the drawing sheet (to the −Y direction) in the TMR element 1a, the return magnetic field 16a is generated in the counterclockwise direction so as to pass the inside of the magnetic yoke 4a surrounding the write bit line 5a and the part of the first level 6F, write current flows from this side to the depth in the direction perpendicular to the drawing sheet (to the +Y direction) in the TMR element 1b, and the return magnetic field 16b is generated in the clockwise direction so as to pass the inside of the magnetic yoke 4b surrounding the write bit line 5b and the part of the first level 6F. In this case, the magnetization direction of the second magnetic layer 8a is the +X direction and the magnetization direction of the second magnetic layer 8b is the −X direction.

In the cases of FIGS. 10A and 10B, the current direction of the write bit line 5a and the part of the first level 6F penetrating the TMR element 1a and that of the write bit line 5b and the part of the first level 6F penetrating the TMR element 1b are opposite to each other. Consequently, the directions of the return magnetic fields 16a and 16b flowing in the pillar yoke 422 (refer to FIG. 6) corresponding to the common part 34 of the magnetic yokes 4a and 4b can be made the same (the −Z direction in FIG. 10A and the +Z direction in FIG. 10B).

As obvious from FIGS. 10A and 10B, according to the directions of the return magnetic fields 16a and 16b generated by the currents flowing in the write bit line 5 and the write word line 6 penetrating the magnetic yokes 4a and 4b, the magnetization direction of the second magnetic layer 8a and that of the second magnetic layer 8b change so as to be opposite to each other. By using the phenomenon, information can be stored in the memory cell 1.

To be specific, when current flows in the same direction in the write bit line 5 and the write word line 6, the magnetization directions of the magnetic yokes 4a and 4b are inverted and, accompanying the inversion, the magnetization directions of the second magnetic layers 8a and 8b change, thereby enabling binary information of "0" or "1" to be stored. In the case where "0" corresponds to, for example, the state of FIG. 10A, specifically, the state where the second magnetic layer 8a is magnetized in the −X direction and the other second magnetic layer 8b is magnetized in the +X direction, "1" corresponds to the state of FIG. 10B, specifically, the state where the second magnetic layer 8a is magnetized in the +X direction and the second magnetic layer 8b is magnetized in the −X direction. In such a manner, information can be stored.

In this case, in the TMR elements 1a and 1b, when the magnetization direction of the first magnetic layers 2a and 2b and that of the second magnetic layers 8a and 8b are parallel, a low resistance state in which large tunnel current flows is obtained. When they are antiparallel to each other, a high resistance state in which only small tunnel current flows is obtained. That is, one of the pair of TMR elements 1a and 1b is always in the low resistance state and the other one is in the high resistance state, thereby storing information. In the case where the write currents flow in the opposite directions in the write bit lines 5a and 5b and the write word line 6 or in the case where the write current flows only in the write bit lines 5a and 5b or the write word line 6, the magnetization direction of each of the second magnetic layers 8a and 8b is not inverted and the data is not rewritten.

In the memory cell 1 in the magnetic memory device of the embodiment having the configuration as described above, by passing the currents in the same direction to both of the write bit lines 5a and 5b and the write word line 6, the direction of the current magnetic field generated by the write bit lines 5a and 5b and that of the current magnetic field generated by the write word line 6 become the same in the magnetic yokes 4a and 4b, so that a synthetic magnetic field can be generated. Consequently, as compared with the case where the magnetic yokes 4a and 4b are not provided and the case where the write bit lines 5a and 5b and the write word line 6 perpendicularly cross each other, higher magnetic flux density is obtained. Thus, the current magnetic field can be used more efficiently and the current necessary to invert the magnetization in the second magnetic layers 8a and 8b can be reduced.

In the magnetic memory device of the embodiment, the pair of open ends K4a faces the pair of end faces K20a, and the pair of open ends K4b faces the pair of end faces K20b. Consequently, the stack bodies S20a and S20b are disposed in the closed magnetic circuit formed in the magnetic yokes 4a and 4b by passing current to both of the write bit lines 5a and 5b and the write word line 6. Therefore, magnetization inversion in the magnetic yokes 4a and 4b in the TMR elements 1a and 1b can be performed more efficiently and a magnetic influence on memory cells adjacent to the memory cell 1 to be subject to writing can be reduced. Further, by the shield effect by the magnetic yokes 4a and 4b, neighboring memory cells can be disposed on the substrate at narrower intervals. Thus, it is advantageous for realizing higher integration and higher packing density of the magnetic memory device. In particular, the second magnetic layer 8a is disposed so as to be in the same level as the pair of facing yokes 411 and 412 and the second magnetic layer 8b is disposed so as to be in the same level as the pair of facing yokes 413 and 414. Consequently, the magnetic flux density of the return magnetic fields passing the second magnetic layers 8a and 8b becomes higher and magnetization inversion in the second magnetic layers 8a and 8b can be performed more efficiently.

Referring now to FIGS. 1, 9, 11A, and 11B, the reading operation in the magnetic memory device of the embodiment will be described.

First, one of the plurality of bit decode lines 71 is selected by the Y-direction address decoder circuit 56A in the first drive control circuit part 56 and a control signal is transmitted to the corresponding Y-direction sense amplification circuit 56B. As a result, read current flows in the read bit lines 33a and 33b and the positive potential is given to the side of the stacked bodies S20a and S20b in the TMR elements 1a and 1b. Similarly, by the X-direction address decoder circuit 58A in the second drive control circuit part 58, one of the plurality of word decode lines 72 is selected and the read switch 83 in the corresponding part is driven. The selected read switch 83 is energized, read current flows in the corresponding read word line 32, and a negative potential is given to the side opposite to that of the stacked bodies S20a and S20b. Therefore, read current necessary for reading can be passed to one memory cell 1 selected by the Y-direction address decoder circuit 56A and the X-direction address decoder circuit 58A. Based on the read current, the magnetization directions of the pair of second magnetic layers 8a and 8b are detected, thereby enabling stored information to be read.

Figure 11A:
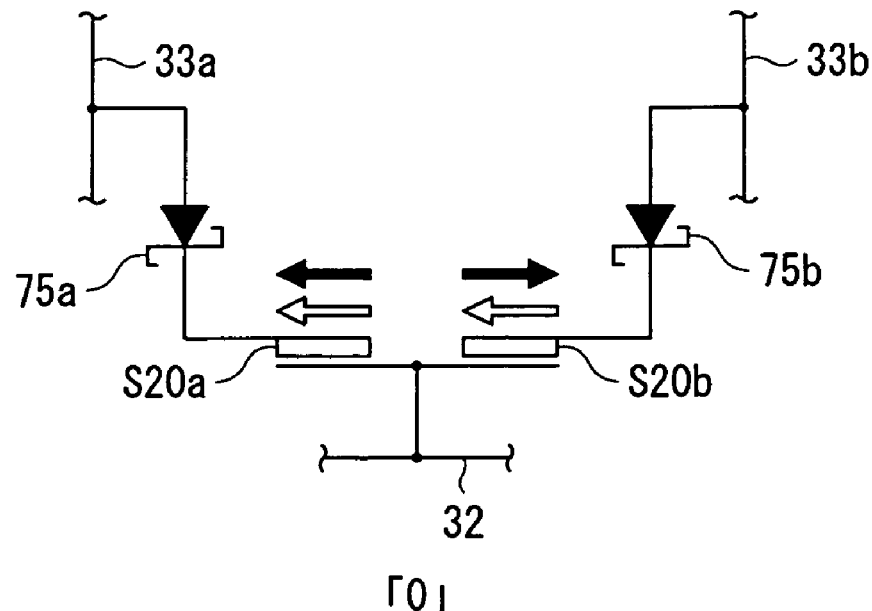
FIG. 11A is a first partial enlarged view of the circuit configuration illustrated in FIG. 9.
Figure 11B:
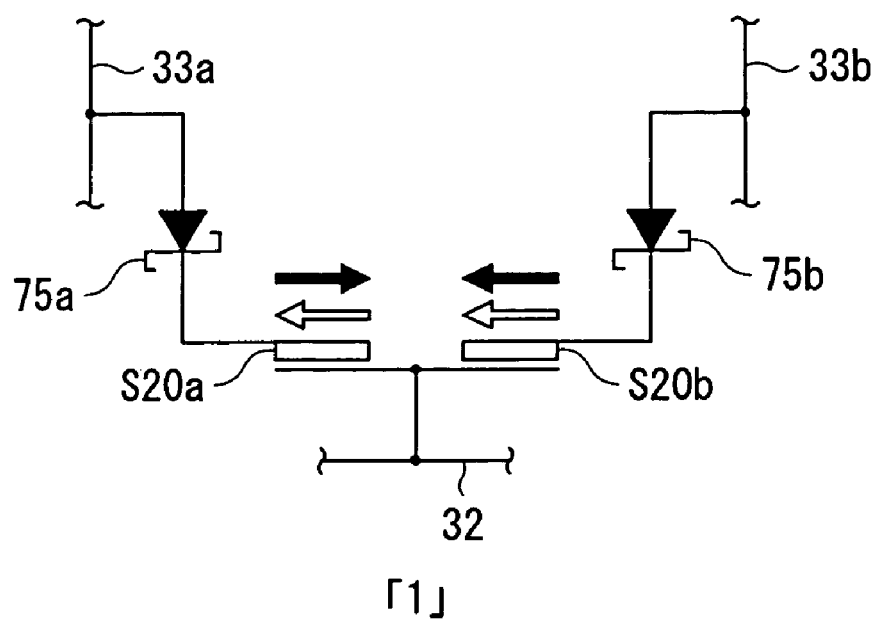
FIG. 11B is a second partial enlarged view of the circuit configuration illustrated in FIG. 9.

FIGS. 11A and 11B are circuit diagrams each showing a portion around the memory cell 1. The magnetization directions of the first magnetic layers 2a and 2b in the stacked bodies S20a and S20b are indicated by hollow arrows and those of the second magnetic layers 8a and 8b are indicated by solid arrows. Both of the magnetization directions of the first magnetic layers 2a and 2b are fixed to the left directions. In FIG. 11A, the magnetization direction of the first magnetic layer 2a and that in the second magnetic layer 2b in the stacked body S20a are parallel, and the magnetization direction of the first magnetic layer 2b and that of the second magnetic layer 2b in the other stacked body S20b are antiparallel to each other. In this case, the stacked body S20a is in the low resistance state, and the stacked body S20b is in the high resistance state. This case corresponds to, for example, "0". In the other case of FIG. 11B, different from the case of FIG. 11A, the stacked body S20a is in the high resistance state and the stacked body S20b is in the low resistance state. This case corresponds to, for example, "1". Such binary information can be obtained by utilizing the fact that the resistance values of the stacked bodies S20a and S20b are different from each other and detecting the difference between the values of currents flowing in the stacked bodies S20a and S20b.

A method of manufacturing the magnetic memory device of the embodiment having the configuration as described above will now be explained.

The method of manufacturing the magnetic memory device of the embodiment includes: a stacked body forming step of forming the pair of stacked bodies S20a and S20b over the substrate 31 provided with the pair of diodes 75a and 75b; a bottom yoke forming step of forming bottom yokes 4B so as to face each other while sandwiching each of the pair of stacked bodies S20a and S20b; a write line forming step of simultaneously forming the pair of parts of the first level 6F and the write bit lines 5a and 5b so as to be disposed adjacent to each other in the first level L1 including the same plane parallel to the layer stack face of the stacked bodies S20a and S20b via the read word line 32 (projection 32T) and an insulating film 7A over the bottom yoke 4B; and a magnetic yoke forming step of forming the pair of magnetic yokes 4a and 4b which are disposed in the circumferential direction so as to surround the pair of write word lines 6B and the write bit lines 5a and 5b in cooperation with the bottom yokes 4B by providing a top yoke 4U around the pair of parts of the first level 6F and the write bit lines 5a and 5b via an insulating film 7B and which share a part each other. The method will be described in detail hereinbelow by referring to the drawings.

A method of manufacturing, mainly, the memory cell 1 in the magnetic memory device will be concretely described hereinbelow by referring to FIGS. 12 to 19. FIGS. 12 to 19 are cross sections taken along line α-α'-α shown in FIG. 3 and show manufacturing processes in order. Although only the TMR 1a in the memory cell 1 is shown and the TMR 1b is not shown in FIGS. 12 to 19, the manufacturing method forms the TMRs 1a and 1b simultaneously.

Figure 12:
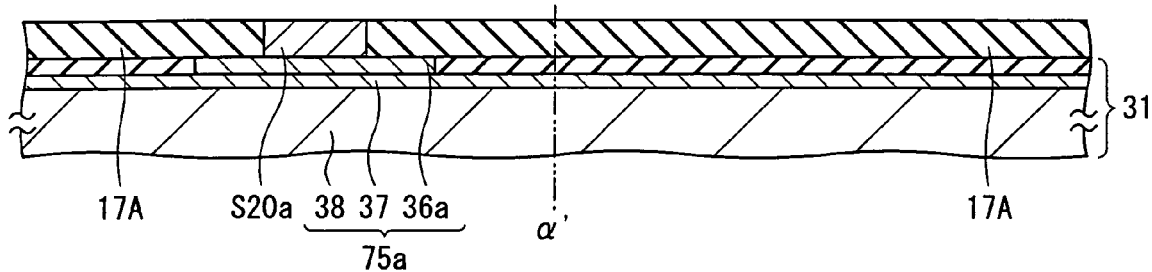
FIG. 12 is an enlarged cross section showing a process in a method of manufacturing the magnetic memory device illustrated in FIG. 1.
Figure 13:
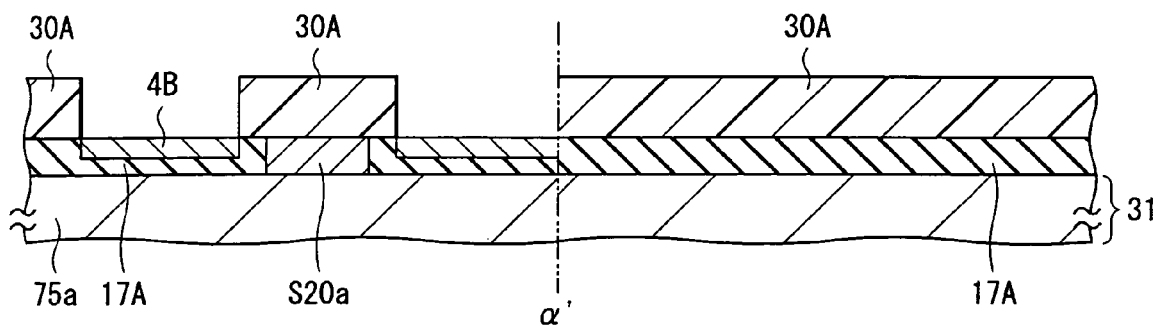
FIG. 13 is an enlarged cross section showing a process subsequent to FIG. 12.

In the bottom yoke forming step, the bottom yoke 4B (specifically, the facing yokes 41a and 41b and part of pillar yokes 421 to 423) is formed over the substrate 31 so as to face each other while sandwiching each of the stacked bodies S20a and S20b. First, as shown in FIG. 12, the substrate 31 in which the diodes 75a and 75b are buried and on which the stacked bodies S20a and S20b and the insulating film 17A surrounding the stacked bodies S20a and S20b and the periphery of the stacked bodies S20a and S20b are formed is prepared. In FIGS. 13 to 19 following FIG. 12, the details of the substrate 31 will be omitted. Subsequently, as shown in FIG. 13, a resist pattern 30A is selectively formed. The resist pattern 30A is used as a mask and the insulating film 17A in not-protected regions is etched to at least a depth corresponding to the thickness of the second magnetic layers 8a and 8b in the stacked bodies S20a and S20b by reactive ion etching (RIE) or the like. After that, the bottom yokes 4B facing each other while sandwiching the stacked bodies S20a and S20b are formed by, for example, sputtering to the level which is the same as that of the top face of the stacked bodies S20a and S20b so as to fill in the etched regions in the insulating film 17A.

Figure 14:
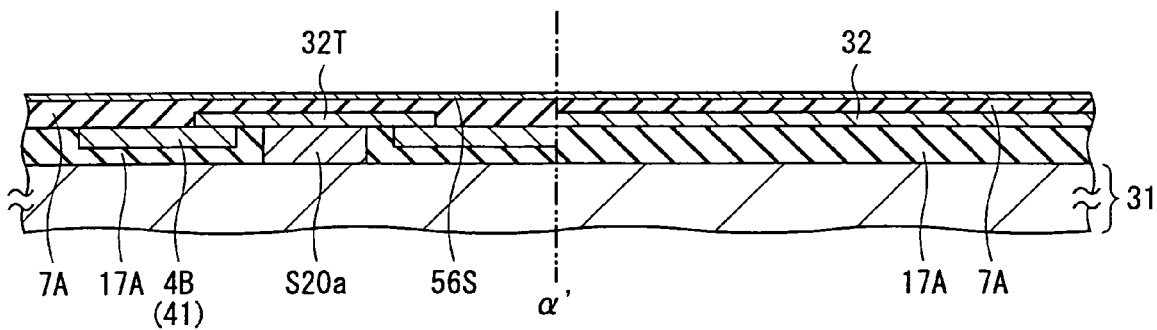
FIG. 14 is an enlarged cross section showing a process subsequent to FIG. 13
Figure 15:
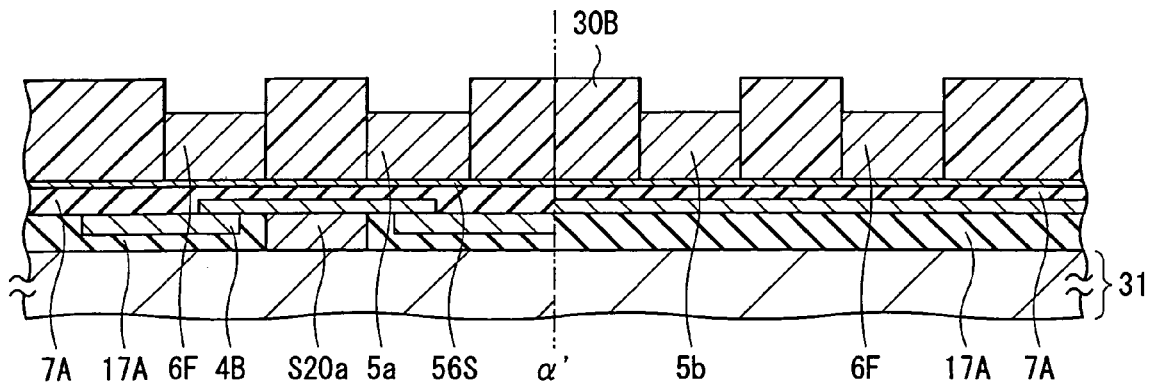
FIG. 15 is an enlarged cross section showing a process subsequent to FIG. 14.
Figure 16:
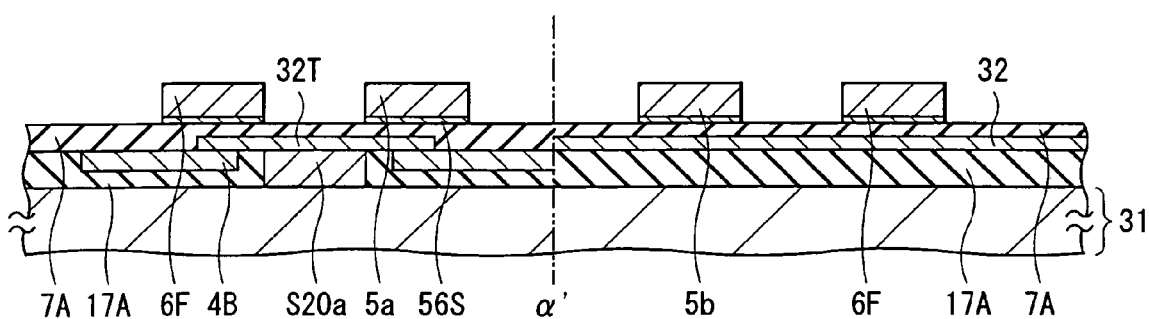
FIG. 16 is an enlarged cross section showing a process subsequent to FIG. 15.

In the following write line forming step, the write bit lines 5a and 5b and the parts of the first level 6F are formed so as to be disposed adjacent to each other in the first level L1. First, as shown in FIG. 14, after the resist pattern 30A is removed, the read word line 32 (projection 32T) is selectively formed so as to be in contact with the top face of the stacked bodies S20a and S20b. Next, the insulating film 7A and an underplating film 56S are sequentially formed on the whole surface. Concretely, for example, by using a CVD apparatus, the insulating film 7A made of aluminum oxide ($Al_2O_3$) or the like is formed and, after that, the underplating film 56S made of a conductive material such as copper (Cu) is formed by sputtering or the like. After that, as shown in FIG. 15, a resist pattern 30B is selectively formed on the underplating film 56S. The resist pattern 30B is formed so as not to cover regions in which the write bit lines 5a and 5b and the parts of the first level 6F are to be formed. The resultant is soaked in a plating bath and a plating process using the underplating film 56S as an electrode is performed, thereby simultaneously forming the write bit lines 5a and 5b and the parts of the first level 6F. After the plating process, as shown in FIG. 16, the resist pattern 30B is removed and, further, the exposed underplating film 56S is removed by milling or the like. Generally, such a thin film patterning method is called a frame plating method.

Figure 17:
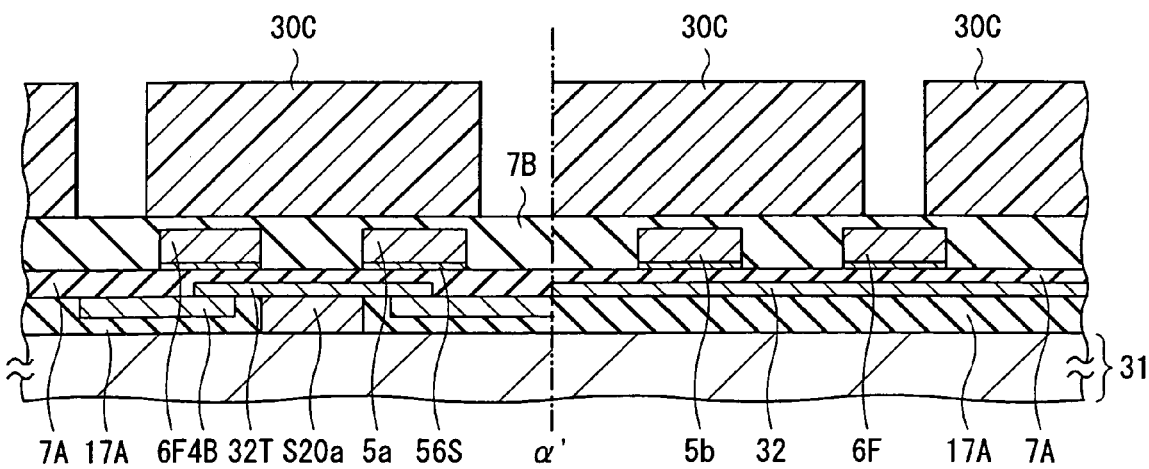
FIG. 17 is an enlarged cross section showing a process subsequent to FIG. 16.
Figure 18:
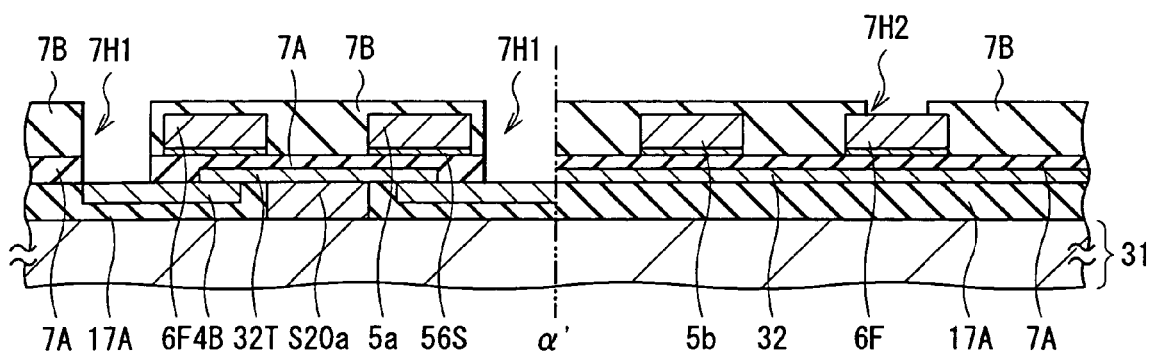
FIG. 18 is an enlarged cross section showing a process subsequent to FIG. 17.
Figure 19:
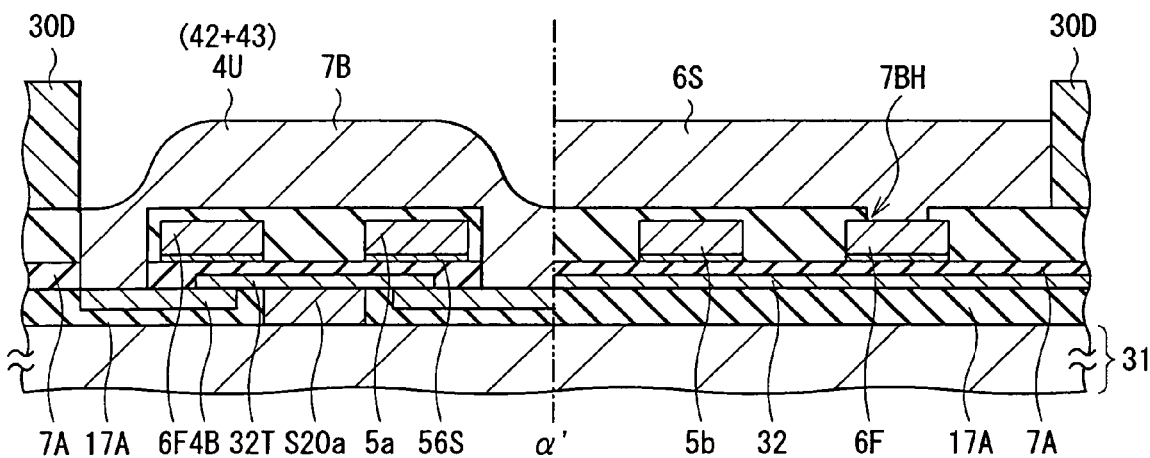
FIG. 19 is an enlarged cross section showing a process subsequent to FIG. 18.

In the following magnetic yoke forming step, the top magnetic yoke 4U (specifically, a pair of pillar yokes 42 and a second beam yoke 43) and the parts of the second level 6S are formed. First, as shown in FIG. 17, the insulating film 7B made of $Al_2O_3$ is formed by sputtering or the like on the whole surface and, after that, a resist pattern 30C is selectively formed on the insulating film 7B. Concretely, the resist pattern 30C is formed so as not to cover parts corresponding to parts on both sides of the regions in which the write bit lines 5a and 5b and the parts of the first level 6F are formed in the region where the bottom yoke 4B is formed and parts corresponding to the parts of the first level 6F in the region where the bottom yoke 4B is not formed. After that, the resist pattern 30C is used as a mask and the insulating films 7A and 7B in the not-protected regions are removed by reactive ion etching (RIE) or the like. By the operation, as shown in FIG. 18, through holes 7H1 and 7H2 are formed, and regions in which the bottom yoke 4B is exposed and a region in which a part of the parts of the first level 6F is exposed appear on both sides of the write bit lines 5a and 5b and the parts of the first level 6F covered with the insulating film 7B. After that, as shown in FIG. 19, a resist pattern 30D having a predetermined shape is formed. By performing a plating process using the resist pattern 30D as a frame, the top yoke 4U and the part of the second level 6S can be formed simultaneously in the second level L2. The formation of the magnetic yoke 4 and the write word line 6 is completed and the memory cell 1 is completed. After completion of the memory cell 1, the read word line 32 having a desired width is formed so as to be electrically connected to the top yoke 4U.

After that, the write word line lead electrodes 46 are formed at both ends of the write word line 6, the write bit line lead electrodes 47 are formed at both ends of the write bit line 5, the read word line lead electrodes 48 are formed at both ends of the read word line 32 and, further, the read bit line lead electrodes 49 are formed at both ends of the read bit line 33.

In such a manner, formation of the memory cell group 54 including the memory cells 1 is completed.

Further, by performing a process of forming a protection layer made of silicon oxide ($SiO_2$), $Al_2O_3$, or the like by a sputtering apparatus, a CVD apparatus, or the like and a process of polishing the protection layer to expose the lead electrodes 46 to 49, manufacture of the magnetic memory device is completed.

As described above, the method of manufacturing the magnetic memory device of the embodiment includes the process of simultaneously forming the write bit lines 5a and 5b and the parts of the first level 6F. Consequently, as compared with the case of forming the write bit lines 5a and 5b and the parts of the first level 6F separately, the memory cell 1 can be formed by the smaller number of processes. In particular, the magnetic yoke forming step includes the step of forming the part of the second level 6S simultaneously with the top magnetic yoke 4U in regions other than the regions surrounded by the magnetic yokes 4a and 4b, so that the manufacturing process can be further simplified.

Figure 20:
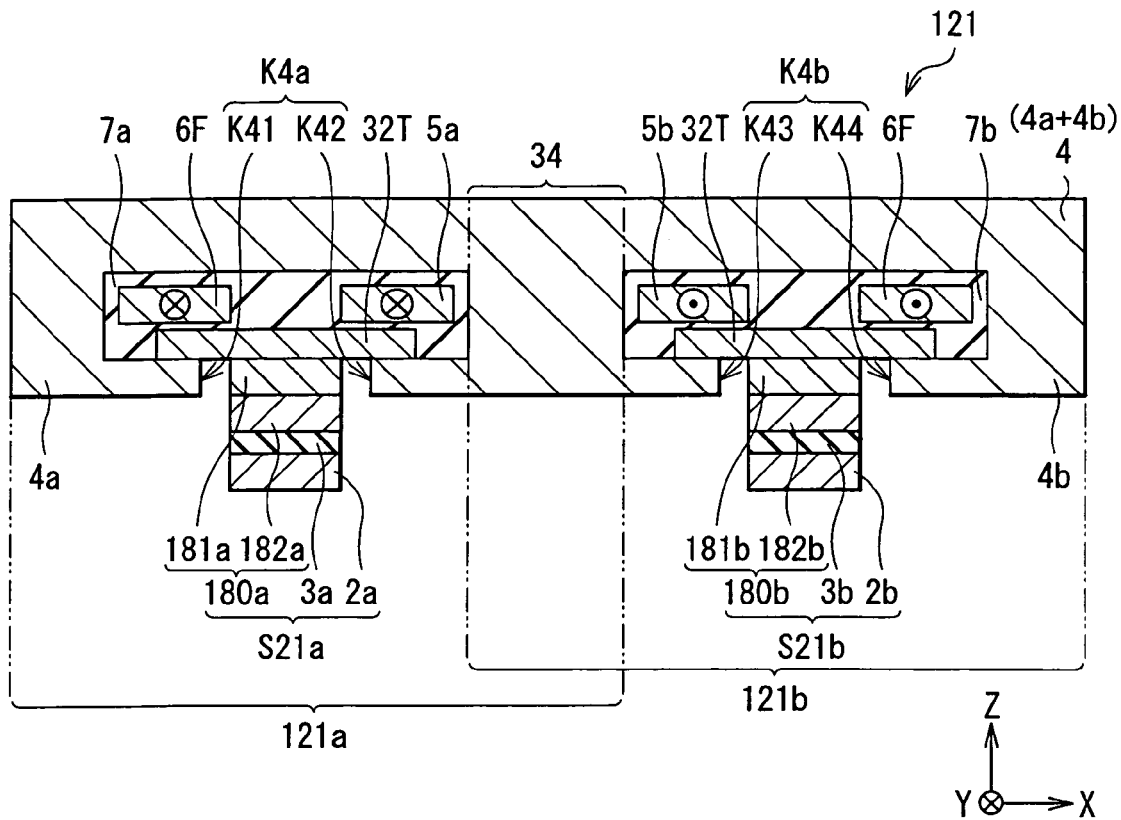
FIG. 20 is a cross section showing the configuration of a main part of a first modification of the magnetic memory device illustrated in FIG. 1.

Although the invention has been described above by the embodiment and examples, the invention is not limited to the foregoing embodiment but can be variously modified. For example, the configuration of the stacked body is not limited to that of the stacked bodies S20a and S20b shown in FIG. 5 in the foregoing embodiment. Like stacked bodies S21a and S21b of a memory cell 121 (first modification) shown in FIG. 20, the second magnetic layers 8a and 8b as magneto-sensitive layers may have a two-layer structure including first free magnetization layers 181a and 181b and second free magnetization layers 182a and 182b having a coercive force larger than that of the first free magnetization layers 181a and 181b, respectively. Although not shown, it is also possible to provide an antiferromagnetic layer on the side opposite to the tunnel barrier layers 3a and 3b, of the first magnetic layers 2a and 2b in the stacked bodies S20a and S20b or the stacked bodies S21a and S21b to thereby stabilize magnetization of the first magnetic layers 2a and 2b. The stacked body is not limited to the configuration that current flows in the direction orthogonal to the layer stack face but may be constructed so that current flows along the layer stack face.

Figure 21:
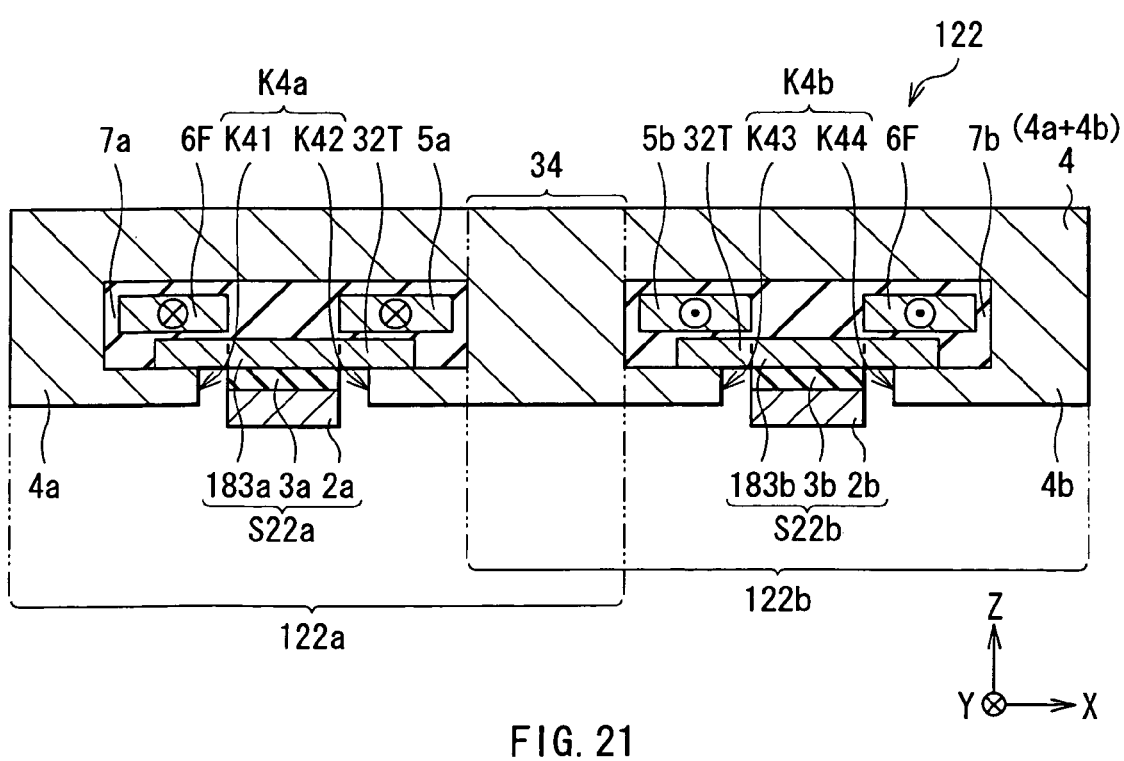
FIG. 21 is a cross section showing the configuration of a main part of a second modification of the magnetic memory device illustrated in FIG. 1.

Like a memory cell 122 in a magnetic memory device as a second modification shown in FIG. 21, part of the projection 32T in the read word line 32 may also serve as a magneto-sensitive layer of the stacked body. Specifically, in the TMR elements 122a and 122b, connection parts 183a and 183b as part of the projections 32T also function as magneto-sensitive layers in stacked bodies S22a and S22b. Consequently, the second magnetic layers 8a and 8b provided in the TMR elements 1a and 1b in the foregoing embodiment can be omitted and the memory cell 122 having a configuration simpler than that of the memory cell 1 can be obtained. In the second embodiment, it is desirable to form the projection 32T by using, for example, NiFe (permalloy) in consideration of conductivity and a soft magnetic property.

Figure 22:
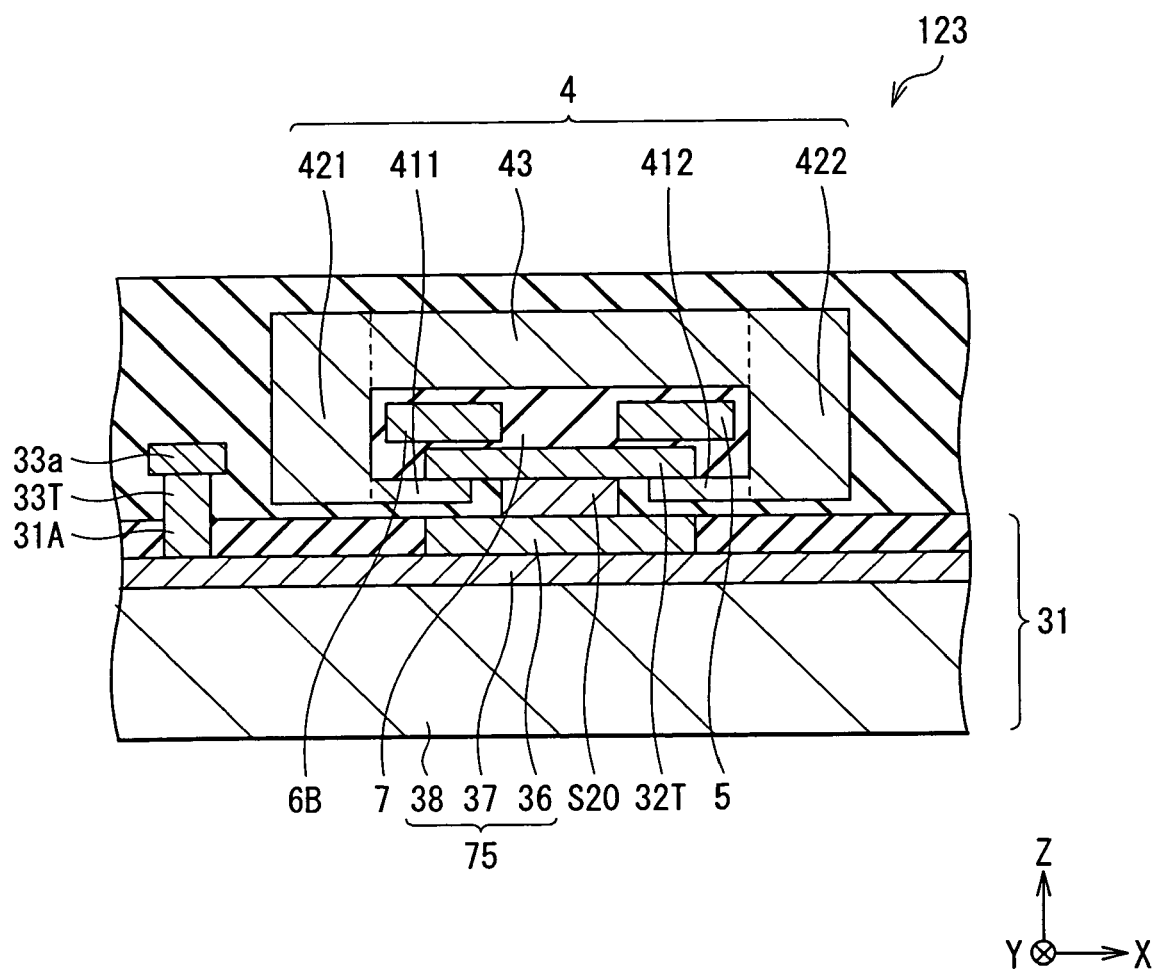
FIG. 22 is a cross section showing the configuration of a main part of a third modification of the magnetic memory device illustrated in FIG. 1.

Although the magnetic memory cell having the pair of magnetoresistive elements has been described above in the foregoing embodiment, the invention is not limited to the configuration. For example, like a TMR element 123 in a magnetic memory device as a third modification shown in FIG. 22, a single TMR element having one magnetic yoke 4 and one stacked body S20 may be used as the magnetic memory device.

Obviously many modifications and variations of the present invention are possible in the light of the above teachings. It is therefore to be understood that within the scope of the appended claims, the invention may be practiced otherwise than as specifically described.

What is claimed is:

1. A magneto-resistive element comprising:
    a magnetic yoke disposed annularly, in a partial region along an extension direction of a conductor, in a circumferential direction so as to surround the conductor, and having a pair of open ends facing each other while sandwiching a gap provided in a part in the circumferential direction;
    a stacked body including a magneto-sensitive layer of which magnetization direction changes according to an external magnetic field and a pair of end faces, and
    the stacked body being disposed in the gap so that each of the pair of end faces and each of the pair of open ends face each other,
    wherein the conductor and the magnetic yoke are insulated from each other.

2. A magneto-resistive element according to claim 1, wherein an insulating layer is provided between each of the pair of end faces and each of the pair of open ends.

3. A magneto-resistive element according to claim 1, wherein area of a cross section orthogonal to the circumferential direction, of the magnetic yoke is the smallest at the pair of open ends.

4. A magneto-resistive element according claim 1, wherein the magnetic yoke includes:
    a pair of facing yokes extending in a direction apart from the pair of open ends and facing each other while sandwiching the gap;
    a pair of pillar yokes each connected to one end on the side opposite to the open end, of each of the pair of facing yokes and extending in the layer stack direction of the stacked body while facing each other; and
    a beam yoke connected to one end on the side opposite to the pair of facing yokes, of each of the pair of pillar yokes.

5. A magneto-resistive element according to claim 4, wherein the magneto-sensitive layer is provided at the same level as that of the pair of facing yokes.

6. A magnetic memory cell having a pair of magneto-resistive elements each comprising:
    a magnetic yoke disposed annularly, in a partial region along an extension direction of a conductor, in a circumferential direction so as to surround the conductor, and having a pair of open ends facing each other while sandwiching a gap provided in a part in the circumferential direction; and
    a stacked body including a magneto-sensitive layer of which magnetization direction changes according to an external magnetic field and a pair of end faces, and the stacked body being disposed in the gap so that each of the pair of end faces and each of the pair of open ends face each other, wherein the conductor and the magnetic yoke are insulated from each other.

7. A magnetic memory cell according to claim 6, wherein an insulating layer is provided between each of the pair of end faces and each of the pair of open ends.

8. A magnetic memory cell according to claim 6, wherein area of a cross section orthogonal to the circumferential direction, of the magnetic yoke is the smallest at the pair of open ends.

9. A magnetic memory cell according to claim 6, wherein each of the pair of magnetic yokes includes:

a pair of facing yokes extending in a direction apart from the pair of open ends and facing each other while sandwiching the gap;

a pair of pillar yokes each connected to one end on the side opposite to the open end, of each of the pair of facing yokes and extending in the layer stack direction of the stacked body while facing each other; and a beam yoke connected to one end on the side opposite to the pair of facing yokes, of each of the pair of pillar yokes, and the pair of magneto-resistive elements shares at least one of the pair of pillar yokes.

10. A magnetic memory cell according to claim 9, wherein the magneto-sensitive layer is provided at the same level as that of the pair of facing yokes.

11. A magnetic memory device comprising:
a first write line;
a second write line extended so as to cross the first write line and, in a portion corresponding to an area of intersection with the first write line, extended parallel to the first write line; and
a magnetic memory cell including a pair of magneto-resistive elements,
wherein each of the pair of magneto-resistive elements has:
a magnetic yoke disposed annularly, in a partial region along an extension direction of the first and second write lines, in a circumferential direction so as to surround the first and second write lines, and having a pair of open ends facing each other while sandwiching a gap provided in a part in the circumferential direction; and a stacked body including a magneto-sensitive layer of which magnetization direction changes according to an external magnetic field and a pair of end faces, the stacked body is disposed in the gap so that each of the pair of end faces and each of the pair of open ends face each other, and the first and second write lines and the magnetic yoke are insulated from each other.

12. A magnetic memory device according to claim 11, wherein an insulating layer is provided between each of the pair of end faces and each of the pair of open ends.

13. A magnetic memory device according to claim 11, wherein area of a cross section orthogonal to the circumferential direction, of the magnetic yoke is the smallest at the pair of open ends.

14. A magnetic memory device according to claim 11, wherein each of the pair of magnetic yokes includes:

a pair of facing yokes extending in a direction apart from the pair of open ends and facing each other while sandwiching the gap;

a pair of pillar yokes each connected to one end on the side opposite to the open end, of each of the pair of facing yokes and extending in the layer stack direction of the stacked body while facing each other; and a beam yoke connected to one end on the side opposite to the pair of facing yokes, of each of the pair of pillar yokes, and the pair of magneto-resistive elements shares at least one of the pair of pillar yokes.

15. A magnetic memory device according to claim 14, wherein the magneto-sensitive layer is provided at the same level as that of the pair of facing yokes.

16. A magnetic memory device according to claim 11, further comprising a read line electrically connected to the stacked body in a region in which the first and second write lines are surrounded by the magnetic yoke.

* * * * *

UNITED STATES PATENT AND TRADEMARK OFFICE
CERTIFICATE OF CORRECTION

PATENT NO. : 7,002,840 B2
DATED : February 21, 2006
INVENTOR(S) : Akifumi Kamijima, Koji Shimazawa and Hitoshi Hatate It is certified that error appears in the above-identified patent and that said Letters Patent is hereby corrected as shown below:

<u>Title page,</u>
Item [75], Inventors, change "Chou-ku" (three occurrences) to -- Chuo-Ku --; and change "Shmazawa" to -- Shimazawa --.

Signed and Sealed this

Thirteenth Day of June, 2006

JON W. DUDAS
*Director of the United States Patent and Trademark Office*